(12) United States Patent
Oh et al.

(10) Patent No.: US 11,309,593 B2
(45) Date of Patent: Apr. 19, 2022

(54) FLEXIBLE CIRCUIT BOARD AND FRAME ASSEMBLY INCLUDING SAME

(71) Applicant: Yura Corporation Co., Ltd., Gyeonggi-do (KR)

(72) Inventors: Jung Hak Oh, Seoul (KR); Jin Su Yeom, Gyeonggi-Do (KR); Jong Won Lee, Gyeonggi-do (KR); Tae Hyeon Jeon, Seoul (KR); Cheon Hyo Lee, Gyeonggi-do (KR); Kwang Ouk Sa, Seoul (KR); Ji Eun Kang, Gyeonggi-do (KR); Seung Jun Noh, Gyeonggi-do (KR)

(73) Assignee: Yura Corporation Co., Ltd., Gyeonggi-do (KR)

( * ) Notice: Subject to any disclaimer, the term of this patent is extended or adjusted under 35 U.S.C. 154(b) by 484 days.

(21) Appl. No.: 16/474,414

(22) PCT Filed: Dec. 27, 2017

(86) PCT No.: PCT/KR2017/015594
§ 371 (c)(1),
(2) Date: Jun. 27, 2019

(87) PCT Pub. No.: WO2018/124751
PCT Pub. Date: Jul. 5, 2018

(65) Prior Publication Data
US 2019/0348720 A1    Nov. 14, 2019

(30) Foreign Application Priority Data

Dec. 27, 2016    (KR) .................... 10-2016-0180292
Dec. 27, 2016    (KR) .................... 10-2016-0180293
(Continued)

(51) Int. Cl.
*H02J 7/00*      (2006.01)
*H01M 10/48*     (2006.01)
(Continued)

(52) U.S. Cl.
CPC .......... *H01M 10/48* (2013.01); *H01M 50/20* (2021.01); *H01M 50/528* (2021.01); *H01M 50/543* (2021.01); *H05K 1/18* (2013.01)

(58) Field of Classification Search
USPC .................... 320/106, 107, 108, 109, 110
See application file for complete search history.

(56) References Cited

U.S. PATENT DOCUMENTS

2008/0316116 A1* 12/2008 Hobson ................ H01Q 9/0421
                                                    343/702
2009/0246627 A1  10/2009 Park
(Continued)

FOREIGN PATENT DOCUMENTS

CN   102308433 A    1/2012
CN   202231958 U *  5/2012 ........... H01L 23/552
(Continued)

OTHER PUBLICATIONS

International Search Report issued in PCT Patent Application No. PCT/KR2017/013561 dated May 31, 2018.
(Continued)

*Primary Examiner* — Brian Ngo
(74) *Attorney, Agent, or Firm* — Marshall, Gerstein & Borun LLP

(57) ABSTRACT

Provided is a flexible circuit board installed on a frame to which a bus bar is coupled. The flexible circuit board may include a central portion having a band shape, first connection circuit portions formed at both ends of the central portion and disposed to face each other, second connection circuit portions extending from the first connection circuit
(Continued)

portions in parallel with the central portion, and third connection circuit portions extending from the first connection circuit portions and the second connection circuit portions and connected to the bus bar. An overlapped may be formed when each of the second connection circuit portions is folded toward one side of each of the first connection circuit portions.

20 Claims, 44 Drawing Sheets

(30) Foreign Application Priority Data

| | | | |
|---|---|---|---|
| Dec. 29, 2016 | (KR) | ...................... | 10-2016-0182296 |
| Dec. 30, 2016 | (KR) | ...................... | 10-2016-0183890 |
| Feb. 28, 2017 | (KR) | ...................... | 10-2017-0026828 |
| Sep. 6, 2017 | (KR) | ...................... | 10-2017-0113677 |
| Oct. 27, 2017 | (KR) | ...................... | 10-2017-0141526 |
| Oct. 27, 2017 | (KR) | ...................... | 10-2017-0141527 |
| Nov. 27, 2017 | (KR) | ...................... | 10-2017-0159696 |

(51) Int. Cl.
*H01M 50/20* (2021.01)
*H01M 50/528* (2021.01)
*H05K 1/18* (2006.01)
*H01M 50/543* (2021.01)

(56) References Cited

U.S. PATENT DOCUMENTS

| | | | |
|---|---|---|---|
| 2011/0059342 A1 | 3/2011 | Lee et al. | |
| 2012/0019061 A1 | 1/2012 | Nishihara et al. | |
| 2012/0214027 A1 | 8/2012 | Ahn | |
| 2012/0328920 A1 | 12/2012 | Takase et al. | |
| 2013/0000957 A1 | 1/2013 | Ikeda et al. | |
| 2014/0193680 A1 | 7/2014 | Lee et al. | |
| 2014/0329124 A1 | 11/2014 | Frohnmayer et al. | |
| 2014/0356687 A1 | 12/2014 | Heo et al. | |
| 2014/0370355 A1 | 12/2014 | Byun et al. | |
| 2016/0248070 A1 | 8/2016 | Ahn | |
| 2018/0019508 A1 | 1/2018 | Lee et al. | |
| 2019/0229413 A1* | 7/2019 | Jong | ......................... H01Q 1/38 |

FOREIGN PATENT DOCUMENTS

| | | | | | |
|---|---|---|---|---|---|
| CN | 102859751 A | | 1/2013 | | |
| CN | 103915597 A | | 7/2014 | | |
| JP | 2002165338 A | * | 6/2002 | ........... | H01R 9/2466 |
| JP | 2003204619 A | * | 7/2003 | | |
| JP | 3680720 B2 | * | 8/2005 | | |
| JP | 2011-210711 A | | 10/2011 | | |
| JP | 2012-523083 A | | 9/2012 | | |
| JP | 2012227004 A | | 11/2012 | | |
| JP | 2013-097894 A | | 5/2013 | | |
| JP | 2013-098032 A | | 5/2013 | | |
| JP | 2014-203619 A | | 10/2014 | | |
| JP | 5715766 B2 | | 5/2015 | | |
| JP | 2015-118731 A | | 6/2015 | | |
| KR | 10-2009-0104583 A | | 10/2009 | | |
| KR | 10-2010-0109857 A | | 10/2010 | | |
| KR | 10-2011-0057470 A | | 6/2011 | | |
| KR | 10-2011-0057540 A | | 6/2011 | | |
| KR | 10-2012-0003432 A | | 1/2012 | | |
| KR | 10-2012-0005728 A | | 1/2012 | | |
| KR | 10-2012-0095295 A | | 8/2012 | | |
| KR | 10-2013-0008136 A | | 1/2013 | | |
| KR | 10-2013-0025245 A | | 3/2013 | | |
| KR | 10-2013-0065686 A | | 6/2013 | | |
| KR | 101273339 B1 | | 6/2013 | | |
| KR | 101329250 B1 | | 11/2013 | | |
| KR | 101329251 B1 | | 11/2013 | | |
| KR | 101329252 B1 | | 11/2013 | | |
| KR | 10-2014-0090077 A | | 7/2014 | | |
| KR | 10-2014-0095660 A | | 8/2014 | | |
| KR | 20140095660 A | | 8/2014 | | |
| KR | 20140102307 A | * | 8/2014 | ........... | H01R 43/26 |
| KR | 10-2014-0137044 A | | 12/2014 | | |
| KR | 10-2014-0139862 A | | 12/2014 | | |
| KR | 10-2014-0145923 A | | 12/2014 | | |
| KR | 20150033176 A | | 4/2015 | | |
| KR | 10-2015-0050314 A | | 5/2015 | | |
| KR | 10-2015-0067694 A | | 6/2015 | | |
| KR | 10-2016-0018982 A | | 2/2016 | | |
| KR | 20160026469 A | | 3/2016 | | |
| KR | 10-2016-0044654 A | | 4/2016 | | |
| KR | 20160041331 A | | 4/2016 | | |
| KR | 20160046477 A | | 4/2016 | | |
| KR | 101647694 B1 | | 8/2016 | | |
| KR | 10-2016-0115582 A | | 10/2016 | | |
| KR | 20160132144 A | | 11/2016 | | |
| KR | 20170001135 U | | 3/2017 | | |
| KR | 101750489 B1 | | 6/2017 | | |
| WO | WO-2010/113455 A1 | | 10/2010 | | |

OTHER PUBLICATIONS

International Search Report issued in PCT Patent Application No. PCT/KR2017/015594 dated Apr. 24, 2018.

European Search Report issued in European Application No. 17888917 dated Feb. 6, 2020.

International Seach Report issued in PCT Patent Application No. PCT/KR2017/013562 dated Mar. 5, 2018.

* cited by examiner

FIG. 32
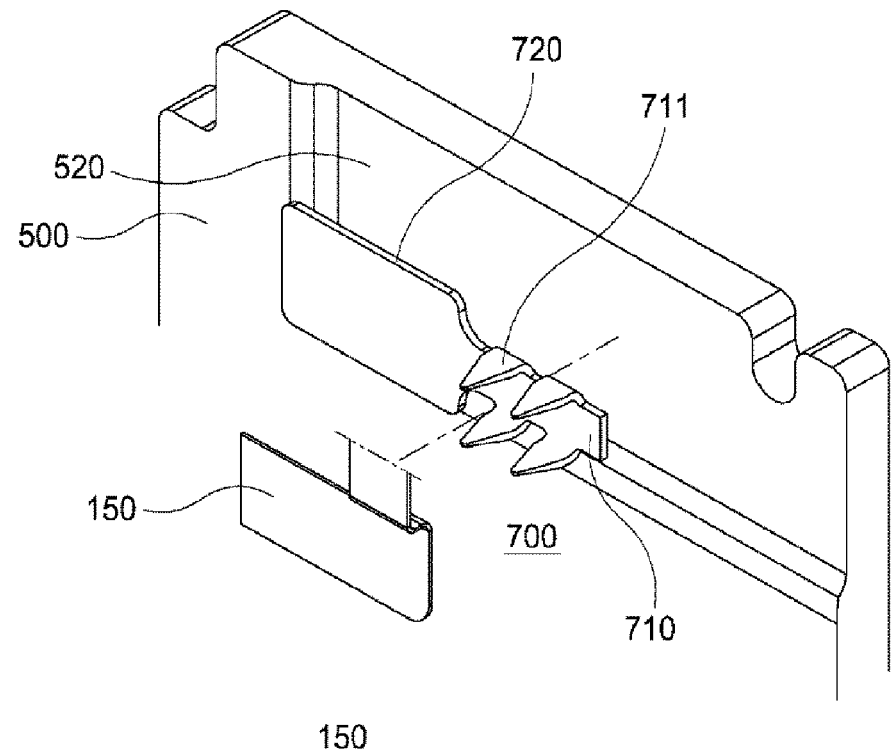
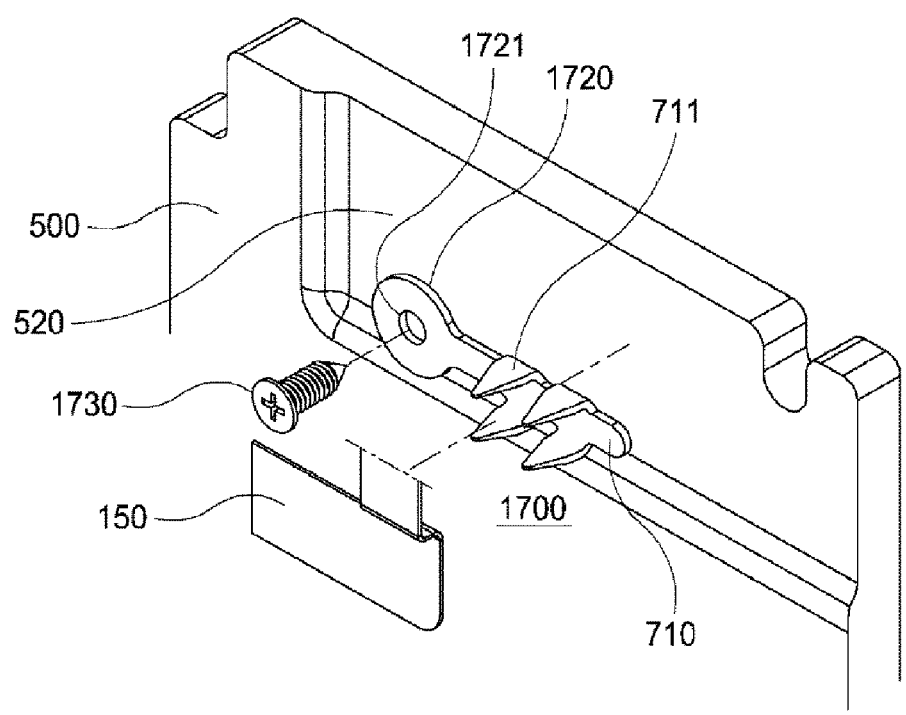

FLEXIBLE CIRCUIT BOARD AND FRAME ASSEMBLY INCLUDING SAME

TECHNICAL FIELD

The present disclosure relates to a flexible circuit board and a frame assembly including the same.

BACKGROUND

A secondary battery is widely used in mobile devices, auxiliary power devices, and the like. In addition, the secondary battery has been attracting attention as a major power source for an electric vehicle, a hybrid electric vehicle, a plug-in hybrid electric vehicle, and the like, which have been proposed as alternatives to solve various problems such as air pollution and the like caused by conventional gasoline vehicles and diesel vehicles.

Due to the necessity of a high-output large-capacity battery, a secondary battery used in an electric vehicle or the like uses a battery module in which a plurality of battery cells are stacked and electrically connected in series and parallel. Such a battery module has an advantage in that it can provide a required high output depending on the degree of stacking of battery cells. However, the battery cells are used in a stacked state and, therefore, some battery cells may suffer from a phenomenon such as overvoltage, overcurrent, overheating, or the like.

Such a phenomenon affects the stability or operation efficiency of the battery module. Thus, a means for detecting such a phenomenon in advance is required. Accordingly, the battery module senses the voltage of each battery cell using a circuit board connected to the battery cell and transmits the sensed voltage as electric information to a battery management system (BMS) through a bus bar, thereby detecting a phenomenon such as overvoltage, overcurrent, overheating or the like of each battery cell and preventing resultant additional damage.

Meanwhile, a flexible circuit board in which a copper foil is laminated between thin insulating layers has been used in various fields in recent years due to the advantage that it is light in weight, occupies a small space, and can be cut into a desired shape. Thus, in a frame assembly of a vehicle, various studies for using a flexible circuit board to sense a battery cell voltage are underway in order to reduce the weight of a vehicle and to improve the fuel efficiency.

SUMMARY

Various embodiments of the present disclosure provide a flexible circuit board for use in a frame assembly for securing a cell assembly. Furthermore, various embodiments of the present disclosure provide a structure of a flexible circuit board capable of improving a yield in a manufacturing process, preventing breakage which may occur during an assembly process and enhancing the workability.

A flexible circuit board according to one embodiment of the present disclosure installed on a frame to which a bus bar is coupled, may include: a central portion having a band shape; first connection circuit portions formed at both ends of the central portion and disposed to face each other; second connection circuit portions extending from the first connection circuit portions in parallel with the central portion; and third connection circuit portions extending from the first connection circuit portions and the second connection circuit portions and connected to the bus bar, wherein an overlapped portion including one portion of each of the second connection circuit portions and another portion of each of the second connection circuit portions overlapped with the one portion of each of the second connection circuit portions in a cross-sectional direction may be formed when each of the second connection circuit portions is folded toward one side of each of the first connection circuit portions, and each of the second connection circuit portions may be disposed on the same line as each of the first connection circuit portions when the overlapped portion is formed.

According to one embodiment, the second connection circuit portions may be formed at both ends of each of the first connection circuit portions, and the overlapped portion may include a first overlapped portion formed by folding each of the second connection circuit portions toward each of the first connection circuit portions along a first bending line and a second overlapped portion formed by bending and folding each of the second connection circuit portions in a longitudinal direction of each of the first connection circuit portions along a second bending line.

According to one embodiment, the first bending line may be formed in parallel with each of the first connection circuit portions, and the second bending line may be formed to be inclined at a predetermined angle with respect to the first bending line.

According to one embodiment, the portions of the second connection circuit portions constituting the first overlapped portion and the second overlapped portion may be closely fixed by an adhesive for providing upward and downward fixing forces.

According to one embodiment, the adhesive may be a double-sided tape or a double-sided pad.

According to one embodiment, the third connection circuit portions formed in the first connection circuit portions may be spaced apart from each other, and the third connection circuit portions formed in the second connection circuit portions may be disposed in series with the third connection circuit portions formed in the first connection circuit portions when the first connection circuit portions and the second connection circuit portions are positioned on the same line.

According to one embodiment, the flexible circuit board may further include: a temperature sensing portion formed to extend outward from the central portion.

According to one embodiment, each of the third connection circuit portions may include a substrate layer and an insulating layer configured to expose one surface of the substrate layer, and the one surface of the substrate layer may be configured to make contact with the bus bar.

According to one embodiment, each of the third connection circuit portions may include a substrate layer and insulating layers configured to expose both surfaces of the substrate layer, and the substrate layer may include a first surface configured to make contact with the bus bar and a second surface formed on an opposite side of the first surface.

According to one embodiment, each of the third connection circuit portions may be configured such that the first surface is larger in size than the second surface.

A frame assembly according to another embodiment of the present disclosure for fixing a cell assembly formed by stacking one or more battery cells may include: a frame disposed to surround the cell assembly and provided with an upper plate and side plates connected to both ends of the upper plate; bus bars disposed on and fixed to the side plates; and a flexible circuit board disposed along the upper plate and the side plates to sense voltages of the battery cells, wherein the upper plate may have a path groove recessed at a predetermined depth on an upper surface of the upper plate, the flexible circuit board may include a band-shaped central portion provided with an outwardly-extending temperature sensing portion and seated in the path groove, first connection circuit portions formed at both ends of the central portion and disposed to face each other, second connection circuit portions extending from both ends of each of the first connection circuit portions in parallel with the central portion, and third connection circuit portions extending from the first connection circuit portions and the second connection circuit portions and connected to the bus bars, the flexible circuit board may be provided with an overlapped portion including a first overlapped portion formed by folding each of the second connection circuit portions toward each of the first connection circuit portions along a first bending line and a second overlapped portion formed by bending and folding each of the second connection circuit portions in a longitudinal direction of each of the first connection circuit portions along a second bending line, when the overlapped portion is formed each of the second connection circuit portions may be disposed on the same line as each of the first connection circuit portions, and the third connection circuit portions formed in the second connection circuit portions may be disposed in series with the third connection circuit portions formed in the first connection circuit portions.

According to one embodiment, the cell assembly may be formed by stacking, in series or in parallel, terminal portions formed at both ends of each of the battery cells, and the terminal portions may be directly joined to and electrically connected to the bus bars.

According to one embodiment, the bus bars may have insertion holes formed in the same direction as the stacking direction of the battery cells, the cell assembly may be formed by stacking the battery cells in parallel and then stacking the battery cells in series, and the terminal portions may be inserted into the insertion holes and electrically connected to the bus bars.

According to one embodiment, the terminal portions may pass through the insertion holes and may have protrusion portions which are bent toward outer surfaces of the bus bars and electrically connected to the bus bars by laser welding.

According to one embodiment, the first bending line may be formed in parallel with each of the first connection circuit portions, the second bending line may be formed to be inclined at a predetermined angle with respect to the first bending line, and each of the second connection circuit portions may be sequentially folded along the first bending line and the second bending line so as to be disposed on the same line as each of the first connection circuit portions.

According to one embodiment, the frame assembly may further include: a reinforcing plate closely fixed to one side of each of the side plates and configured to cover ends of the central portion, wherein the upper plate further may have ribs formed along the path groove to prevent the central portion from being separated from the path groove.

According to one embodiment, the ribs may be alternately provided on both sides of the path groove so as to be spaced apart from each other.

According to one embodiment, the side plates may have fusion protrusions formed to correspond to an arrangement position of the central portion, and the central portion and the reinforcing plate may have fixing holes formed to correspond to positions of the fusion protrusions.

According to one embodiment, the frame assembly may further include: a top cover configured to cover an upper surface of the central portion in a state in which the central portion is seated in the path groove.

According to one embodiment, each of the bus bars may have a seat portion recessed at a predetermined depth, and the frame assembly may further include: a connection terminal fixedly coupled to the flexible circuit board on one side and joined to each of the bus bars on the other side, wherein the connection terminal may include a fixing portion provided with fixing protrusions and fixed to each of the third connection circuit portions, and a connecting portion formed to extend from the fixing portion and disposed in the seat portion.

According to one embodiment, the fixing protrusions may be formed on both sides of the fixing portion in a spaced-apart relationship with each other, the fixing protrusions may be electrically connected to the flexible circuit board through the third connection circuit portions at predetermined positions, the fixing protrusions may have protrusion portions fixed by compression and deformation, and the connecting portion may be joined to the seat portion.

According to one embodiment, the connecting portion may be formed in a ring shape so as to have a fastening hole, and the frame assembly may further include: a fastening member inserted into the seat portion through the fastening hole to fix the connection terminal.

According to one embodiment, the frame assembly may further include: a coating portion configured to cover the third connection circuit portions and a portion of the bus bars around the third connection circuit portions in a state in which the third connection circuit portions are connected to the bus bars.

According to one embodiment, each of the bus bars may have a seat portion recessed at a predetermined depth, and one surface of each of the third connection circuit portions may be brought into contact with the seat portion.

A frame assembly according to a further embodiment of the present disclosure for fixing a cell assembly formed by stacking one or more battery cells, may include: a frame disposed to surround the cell assembly and provided with an upper plate and side plates connected to both ends of the upper plate; bus bars disposed on and fixed to the side plates; a flexible circuit board disposed along the upper plate and the side plates to sense voltages of the battery cells; and a reinforcing plate closely fixed to one side of each of the side plates and configured to cover end portions of the flexible circuit board, wherein the upper plate may have a protection groove recessed at a predetermined depth on a bottom surface of the upper plate, the flexible circuit board may include a band-shaped central portion provided with an outwardly-extending temperature sensing portion and accommodated in the protection groove, first connection circuit portions formed at both ends of the central portion and disposed to face each other, second connection circuit portions extending from both ends of each of the first connection circuit portions in parallel with the central portion, and third connection circuit portions extending from the first connection circuit portions and the second connection circuit portions and connected to the bus bars, the flexible circuit board may be provided with an overlapped portion including a first overlapped portion formed by folding each of the second connection circuit portions toward each of the first connection circuit portions along a first bending line and a second overlapped portion formed by bending and folding each of the second connection circuit portions in a longitudinal direction of each of the first connection circuit portions along a second bending line, when the overlapped portion is formed, each of the second connection circuit portions may be disposed in parallel with each of the first connection circuit portions, and the third connection circuit portions formed in the second connection circuit portions may be disposed in parallel with the third connection circuit portions formed in the first connection circuit portions.

According to one embodiment, the overlapped portion formed between the protection groove and the central portion and the overlapped portion formed between each of the first connection circuit portions and each of the second connection circuit portions may be closely fixed by an adhesive.

According to one embodiment, a protection hole may be formed in at least one of the upper plate and the side plates in a corresponding relationship with a position of the protection groove, and the central portion may have an end portion formed to pass through the protection hole and bent so that each of the third connection circuit portions is joined to an outer surface of each of the bus bars.

According to one embodiment, a fusion protrusion may be formed on each of the side plates in a corresponding relationship with a position of the protection hole, and fixing holes may be formed in the central portion and the reinforcing plate in a corresponding relationship with a position of the fusion protrusion.

According to one embodiment, a first coupling hole may be formed in each of the bus bars, a second coupling hole is formed in each of the third connection circuit portions in a corresponding relationship with a position of the first coupling hole, and the frame assembly may further include a coupling member configured to pass through the first coupling hole and the second coupling hole.

According to one embodiment, a seat groove recessed at a predetermined depth may be formed in each of the bus bars, the first coupling hole may be formed in the seat groove, and the first coupling hole and the second coupling hole may be formed as a pair in a spaced-apart relationship with each other.

According to one embodiment, the coupling member may be a rivet.

As described above, according to the embodiments of the present disclosure, it is possible to expect various effects including all of the following effects. However, the present disclosure is not required to exhibit all of the following effects.

In the flexible circuit board according to the present disclosure, the first connection circuit portions are bent and connected to the ends of the first connection circuit portions. The second connection circuit portions are formed parallel to the central portion. Therefore, as compared with a comparative example where the first connection circuit portions and the second connection circuit portions are cut in parallel at the time of initial cutting, it is possible to minimize the loss of a material in design and to reduce the manufacturing cost.

Further, the second connection circuit portions are folded along the first bending line and the second bending line and are positioned on the same line as the first connection circuit portions. Therefore, it is possible to improve the production yield and to sense voltages of a plurality of battery cells stacked at a large width.

The first overlapped portion and the second overlapped portion are closely fixed by a double-sided tape or a double-sided pad. Therefore, it is possible to prevent damage due to lifting in the assembly process and to prevent pattern cracking of the flexible circuit board due to vibration.

In addition, since the internal substrate layer of the flexible circuit board is exposed, the third connection circuit portions can be directly joined to the bus bars without having to use an additional configuration. Inasmuch as there is no need to use an additional configuration, it is possible to reduce the cost.

Since the first surface is larger in size than the second surface, it is possible to facilitate the joining operation and to protect the substrate layer.

The cell assembly of the battery module according to the present disclosure can be electrically connected with ease via the terminal portions formed in the battery cells. The insertion holes are formed in the bus bars, and the terminal portions can be folded and electrically connected to the bus bars through the insertion holes. This makes it easy to assemble the cell assembly.

The battery cells are primarily fixed by the cell frame provided with the upper plate and the side plates and configured to surround the cell assembly. This makes it possible to protect the battery cells.

The upper plate and the side plates are hingedly coupled to each other. The side plates are rotated at a certain angle so as to facilitate the assembling of the frame.

The path groove recessed at a predetermined depth may be formed on the upper surface of the upper plate, or the protection groove recessed at a predetermined depth may be formed on the bottom surface of the upper plate. Therefore, it is possible to protect the central portion of the flexible circuit board and to prevent damage which may occur in the assembly process.

The ribs for preventing separation of the central portion may be formed along the path groove to facilitate the fixing of the flexible circuit board. The ribs are alternately formed on both sides of the path groove to prevent damage to the flexible circuit board which may occur in the assembly process.

By providing the top cover for covering the upper side of the flexible circuit board in a state in which the flexible circuit board is seated in the path groove, it is possible to minimize damage to the flexible circuit board that may occur during the assembly process.

The central portion can be easily fixed to the protection groove by the double-sided tape. The protection hole is formed in a corresponding relationship with the position of the protection groove. Therefore, it is possible to minimize the bent portions of the flexible circuit board and to prevent damage to the flexible circuit board which may be caused by the external force generated in the assembly process or the vehicle driving process.

In addition, the frame assembly includes the reinforcement plate closely fixed to one side of each of the side plates and configured to cover the ends of the central portion. Therefore, it is possible to more reliably prevent the possibility of damage which may occur in the process of assembling the flexible circuit board.

The reinforcing plate covers the ends of the central portion and can prevent damage to the flexible circuit board which may occur during the thermal fusion process.

The seat portion is formed at a predetermined depth in each of the bus bars. This makes it possible to clarify the joint portion and to improve the workability. Thus, the joining can be performed at the correct position, thereby improving the joining quality.

The flexible circuit board and the bus bars can be electrically connected to each other through the integral terminals, thereby reducing the number of work steps and reducing the production cost.

Since the ring-shaped integral terminal can be connected to each of the bus bars by the fastening member (for example, a screw), it is possible to reduce the number of work steps such as laser welding and the like and to improve the productivity.

When the substrate layer is directly joined to the bus bars, the coating portion covering the third connection circuit portions and a part of the bus bars may be further formed to increase the joining force between the substrate layer and the bus bars, thereby protecting the substrate layer.

The coupling member may be made of a metal material having electrical conductivity to electrically connect the bus bars and the flexible circuit board. It is therefore possible to fundamentally prevent distortion due to welding and occurrence of cracks at the welding portions.

BRIEF DESCRIPTION OF THE DRAWINGS

FIG. 32 is a perspective view showing a method in which the fixing portion shown in FIGS. 28 and 30 is fixed to the third connection circuit portion.

DETAILED DESCRIPTION

Figure 1:
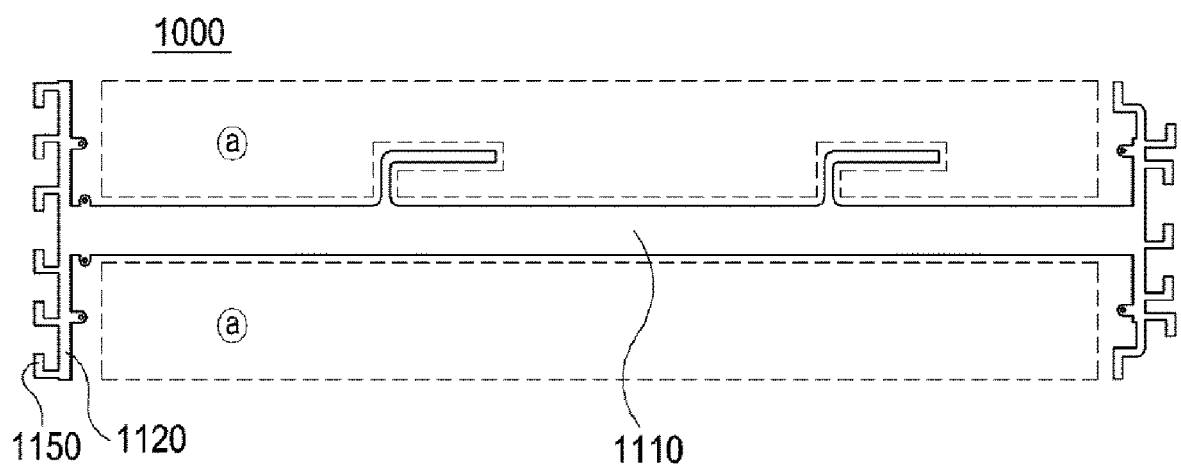
FIG. 1 is a view for explaining a comparative example for comparison with various embodiments of the present disclosure.

Embodiments of the present disclosure are illustrated for the purpose of explaining the technical idea of the present disclosure. The scope of the rights according to the present disclosure is not limited to the embodiments presented below or the detailed descriptions of such embodiments.

All technical and scientific terms used in the present disclosure have the meaning generally understood by those of ordinary skill in the art to which the present disclosure pertains, unless otherwise defined. All terms used in the present disclosure are chosen for the purpose of more clearly describing the present disclosure and are not chosen to limit the scope of rights according to the present disclosure.

As used in the present disclosure, expressions such as "comprising", "including", "having", and the like are to be understood as open-ended terms having the possibility of encompassing other embodiments, unless otherwise mentioned in the phrase or sentence containing such expressions.

The singular form described in the present disclosure may include a plural meaning, unless otherwise mentioned. This applies equally to the singular form recited in the claims.

As used in the present disclosure, the expressions such as "first", "second" and the like are used to distinguish a plurality of components from each other and are not intended to limit the order or importance of the components.

In the present disclosure, when it is mentioned in the present disclosure that one element is "connected" to another element, it is to be understood that said one element may be directly connected to said another element, or may be connected to said another element via a new additional element.

Hereinafter, descriptions are made as to embodiments of the present disclosure with reference to the accompanying drawings. In the accompanying drawings, the same or corresponding elements are denoted by the same reference numerals. In the following descriptions of the embodiments, descriptions of the same or corresponding elements may be omitted. However, even if the descriptions of elements are omitted, it is not intended that such elements are not included in a certain embodiment.

FIG. 1 is a view for explaining a comparative example for comparison with various embodiments of the present disclosure.

As a high-output large-capacity battery is required in recent years, the number of stacked battery cells is increasing. In this process, the flexible circuit board 1000 of the comparative example is cut and used in a form in which the sensing portion of a battery cell is formed to be wide. For example, as shown in FIG. 1, the flexible circuit board 1000 is cut in such a shape as to include a band-shaped central portion 1110, connecting portions 1120 formed at both ends of the central portion 1110 and arranged so as to face each other, and third connection circuit portions 1150 protruding from the connecting portions 1120 so as to be connected to a bus bar.

In the above-described comparative example, a problem may be posed in that the waste portions (a) formed on both sides of the central portion 1110 is increased and the production yield of the flexible circuit board 1000 is reduced to some extent. Furthermore, there may be posed a problem in that in the process of assembling the flexible circuit board 1000 to the frame, the flexible circuit board is broken or torn due to an external force or the like and the electric device mounted on the flexible circuit board is damaged. As a result, a problem may be posed in that cracks are generated in the portions of the flexible circuit board bent as side plates due to the severe vibration or impact applied to the battery module.

Figure 2:
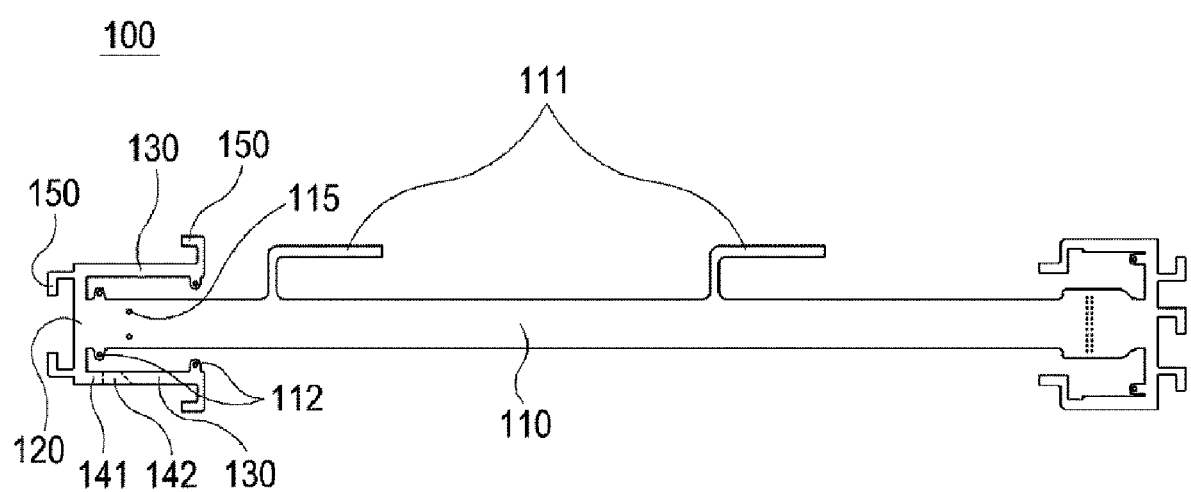
FIG. 2 is a plan view of a flexible circuit board according to one embodiment of the present disclosure.
Figure 3:
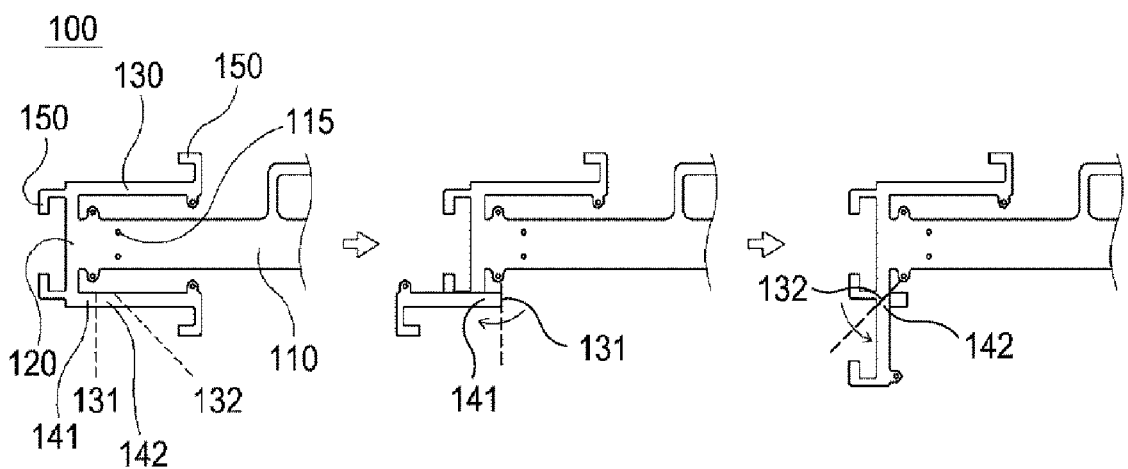
FIG. 3 is a view showing a folding method of the flexible circuit board shown in FIG. 2.
Figure 4:
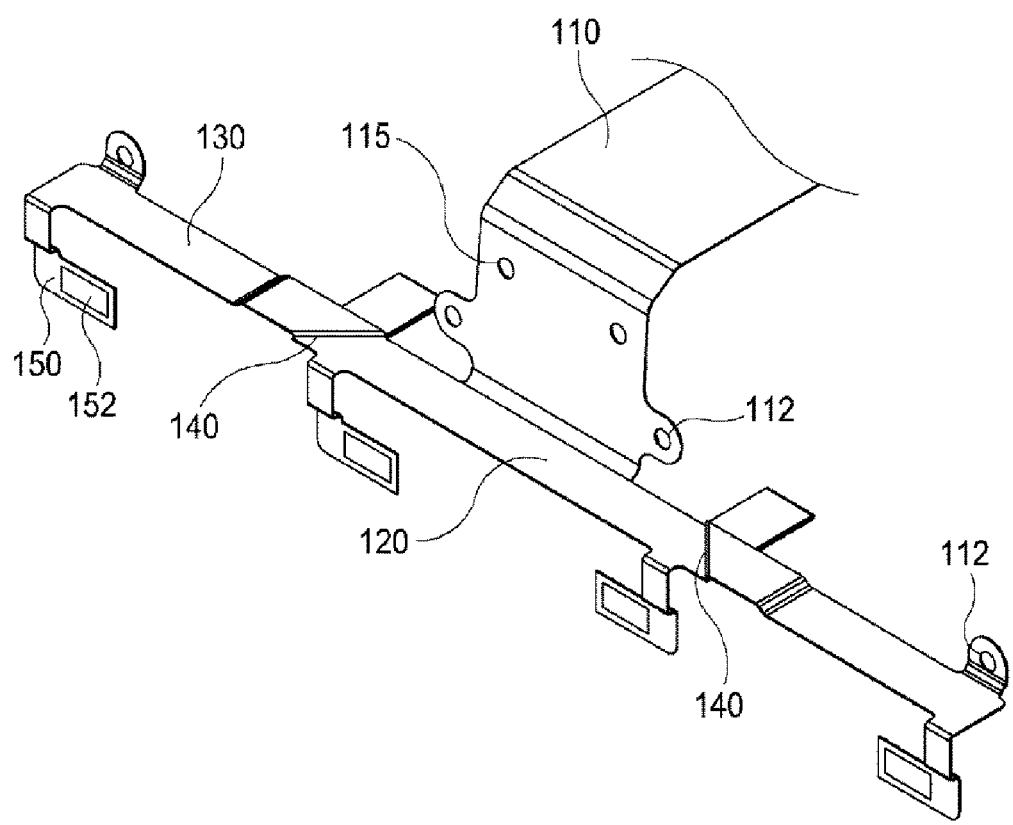
FIG. 4 is a perspective view showing a final shape of a connecting portion on one side of the flexible circuit board shown in FIG. 2.
Figure 5:
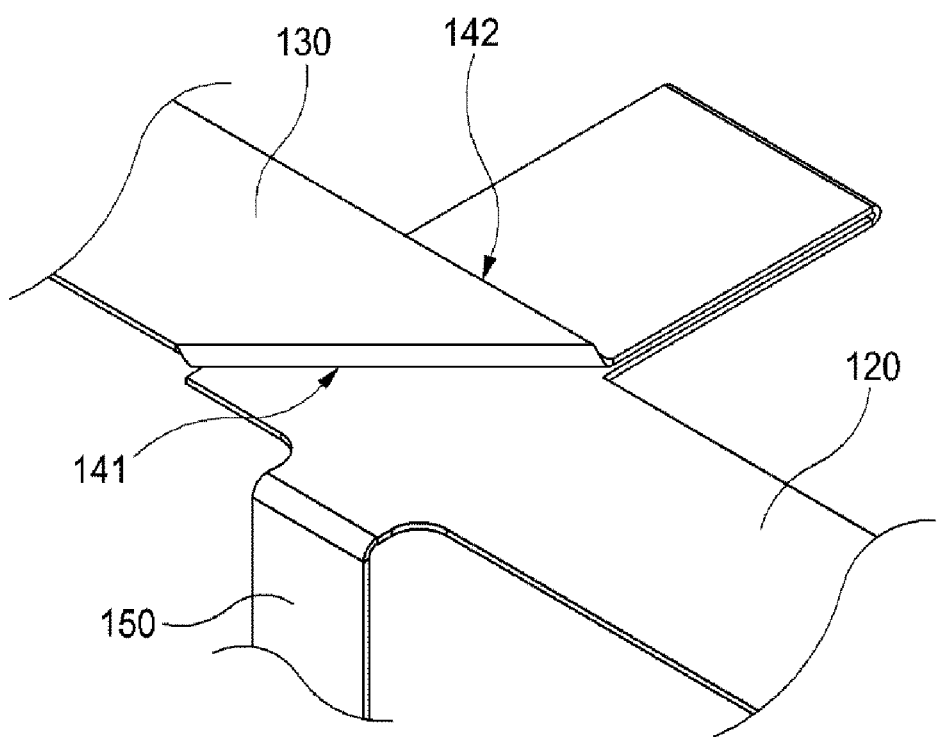
FIG. 5 is an enlarged perspective view of the overlapped portion shown in FIG. 4.
Figure 6:
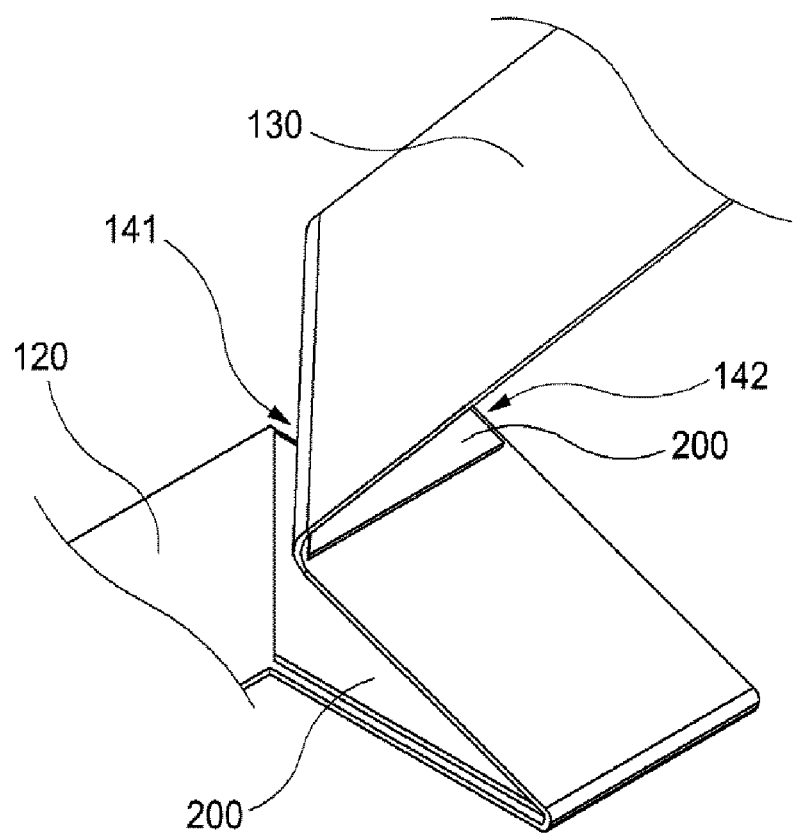
FIG. 6 is a perspective view showing a method in which the first and second overlapped portions shown in FIG. 5 are fixed by an adhesive.

FIG. 2 is a plan view of a flexible circuit board 100 according to one embodiment of the present disclosure. FIG. 3 is a view showing a folding method of the flexible circuit board 100 shown in FIG. 2. FIG. 4 is a perspective view showing a final shape of a connecting portion on one side of the flexible circuit board 100 shown in FIG. 2. FIG. 5 is an enlarged perspective view of the overlapped portion 140 shown in FIG. 4. FIG. 6 is a perspective view showing a method in which the first overlapped portion 141 and the second overlapped portion 142 shown in FIG. 5 are fixed by an adhesive 200.

Referring to FIGS. 2 through 6, the flexible circuit board 100 installed on a frame coupled with a bus bar and configured to sense a voltage of a battery cell may include a band-shaped central portion 110, first connection circuit portions 120 formed at both ends of the central portion 110 and disposed to face each other, and second connection circuit portions 130 bent to extend from the first connection circuit portions 120 and formed in parallel with the central portion 110. Third connection circuit portions 150 may be formed to extend from the first connection circuit portions 120 and the second connection circuit portions 130 and may be connected to a bus bar.

When each of the second connection circuit portions 130 is folded to one side of each of the first connection circuit portions 120, an overlapped portion 140 may be formed between each of the first connection circuit portions 120 and each of the second connection circuit portions 130. When the overlapped portion 140 is formed, each of the second connection circuit portions 130 may be disposed on the same line as each of the first connection circuit portions 120.

Figure 9:
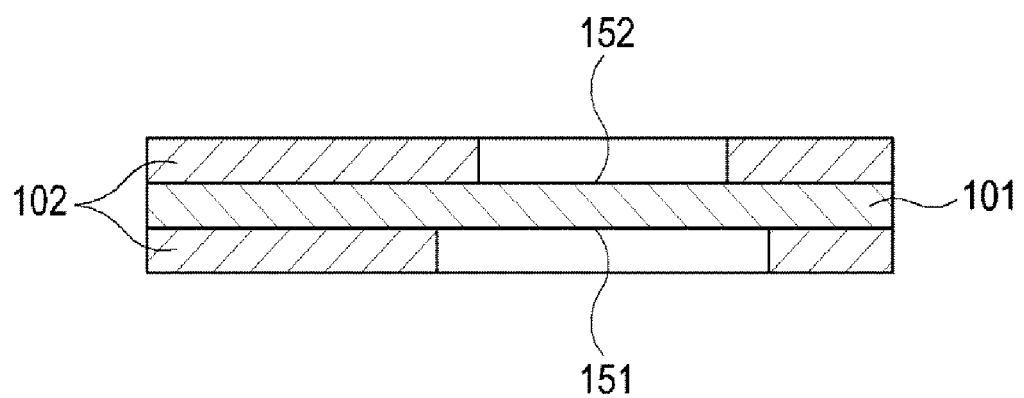
FIG. 9 is a sectional view showing a cross section of the third connection circuit portion shown in FIG. 8.

Referring to FIG. 9, a substrate layer 101 may be formed at the center of the flexible circuit board 100 in the cross-sectional direction, and insulating layers 102 may be laminated and formed above and below the substrate layer 101. The substrate layer 101 may be formed of a circuit for transmitting information as an electrical signal. The insulating layers 102 may protect the substrate layer 101 and may prevent the substrate layer 101 from being short-circuited with other conductive components.

Referring to FIG. 9, the substrate layer 101 is formed of an electrically conductive metal layer and may be formed of a copper plate having high electrical conductivity. The insulating layers 102 may be made of a non-electrically conductive material in the form of films PEN, PI. Furthermore, each of the substrate layer 101 and the insulating layers 102 has flexibility and may be easily deformed.

Referring again to FIG. 2, the flexible circuit board 100 may include the central portion 110, the first connection circuit portions 120 and the second connection circuit portions 130. The overlapped portions 140 may be formed between the first connection circuit portions 120 and the second connection circuit portions 130. The first connection circuit portions 120, the second connection circuit portions 130 and the overlapped portions 140 may correspond to portions of the flexible circuit board 100 and may be integrally formed with the central portion 110 to constitute one flexible circuit board.

A first fixing hole 115 may be formed at an end of the central portion 110. Furthermore, protrusion holes 112 may be additionally formed in the portions protruding from the central portion 110 and the second connection circuit portions 130.

The center portion 110 may be formed to be long in a band shape. Temperature sensing portions 111 may extend outwardly from the central portion 110. The temperature sensing portions 111 may be provided so as to extend to one side. The temperature sensing portions 111 may be configured to measure the temperature of a battery cell and to transmit the measured temperature as electrical information to an external device through the flexible circuit board 100 so that a phenomenon such as overheating or the like can be detected.

The first connection circuit portions 120 and the second connection circuit portions 130 may be formed at both ends of the center portion 110 in the same form. Hereinafter, various embodiments of the present disclosure will be described based on the portions formed on one side of the central portion 110.

The first connection circuit portion 120 is formed at each of both ends of the central portion 110. The first connection circuit portion 120 may extend toward both sides from one end of the central portion 110 and may have a shape perpendicular to the central portion 110. In addition, the first connection circuit portion 120 may extend to the opposite sides across the central portion 110.

The second connection circuit portions 130 may be bent from the first connection circuit portion 120. The second connection circuit portions 130 are bent at a right angle with respect to the first connection circuit portion 120 to extend in parallel with the central portion 110. The second connection circuit portions 130 may be formed at each end of the first connection circuit portion 120. For example, four second connection circuit portions 130 may be formed in one flexible circuit board 100.

The overlapped portion 140 may be formed between the first connection circuit portion 120 and the second connection circuit portions 130. The overlapped portion 140 may be defined as a portion where the second connection circuit portions 130 is folded to one side of the first connection circuit portion 120 and is overlapped in a plurality of layers.

The overlapped portion 140 may include a first overlapped portion 141 formed by folding the second connection circuit portion 130 upward toward the first connection circuit portion 120 along a first bending line 131 and a second overlapped portion 142 formed by further folding the second connection circuit portion 130 upward in the longitudinal direction of the first connection circuit portion 120 of the first overlapped portion 141 along a second bending line 132. That is, the overlapped portion 140, which is formed by folding the second connection circuit portion 130 along the first bending line 131 and the second bending line 132, corresponds to a part of the second connection circuit portion 130.

In the case where the overlapped portion 140 is formed, the second connection circuit portion 130 may be disposed in parallel with the first connection circuit portion 120. Furthermore, the third connection circuit portion 150 formed on the second connection circuit portion 130 may be disposed in parallel with the third connection circuit portion 150 formed on the first connection circuit portion 120. In various embodiments of the present disclosure, the case where two components are disposed in parallel includes not only a case where two components are completely parallel to each other so that the extension lines thereof do not meet with each other but also a case where two components are inclined at a predetermined angle so as to be substantially parallel to each other.

In the flexible circuit board 100 according to one embodiment, the first bending line 131 may be formed in parallel with the longitudinal direction of the first connection circuit portion 120. The second bending line 132 may be formed in an oblique direction so as to make an angle of about 45 degrees with respect to the first bending line 131.

A folding method of the second connection circuit portion 130 will be described with reference to FIG. 3. In a state (first state) in which the second connection circuit portion 130 is formed in parallel with the central portion 110, the second connection circuit portion 130 is folded along the first bending line 131 to the upper side of the first connection circuit portion 120 and comes into a state (second state) in which the second connection circuit portion 130 is formed parallel with the central portion 110 on the opposite side of the central portion 110. The first overlapped portion 141 is formed between the first connection circuit portion 120 and the second connection circuit portion 130. Next, the second connection circuit portion 130 is fold to the upper side of the first overlapped portion 141 along the second bending line 132 comes into a state (third state) in which the second connection circuit portion 130 is disposed on the same line as the first connection circuit portion 120. The second overlapped portion 142 may be formed between the first overlapped portion 141 and the second connection circuit portion 130.

Two overlapped portions 140 and two bending lines 131 and 132 are not necessarily formed on the basis of one second connection circuit portion 130. The number of the overlapped portions 140 and the bending lines 131 and 132 may be differently set depending on the cut shape and final shape of the flexible circuit board 100.

Portions of the second connection circuit portion 130 that constitute the first overlapped portion 141 and the second overlapped portion 142 may be tightly fixed by an adhesive 200. The adhesive 200 may be configured to provide fixing forces on the upper side and the lower side thereof. The adhesive 200 may be, for example, a double-sided tape or a double-sided pad. The use of the adhesive 200 makes it possible to minimize the increase in the thickness of the flexible circuit board 100 due to the overlapping of the portions of the flexible circuit board 100 and to prevent lifting of the portions of the flexible circuit board 100, thereby preventing damage due to vibration in an assembling process or during a vehicle transportation.

According to the above-described embodiment, the flexible circuit board 100 may have a final shape after the folding operation, which is different from the cut shape before the bending operation. Accordingly, it is possible to improve the yield in the manufacturing process of the flexible circuit board 100 and to sense a voltage of each of the plurality of battery cells stacked in an increased width.

Figure 7:
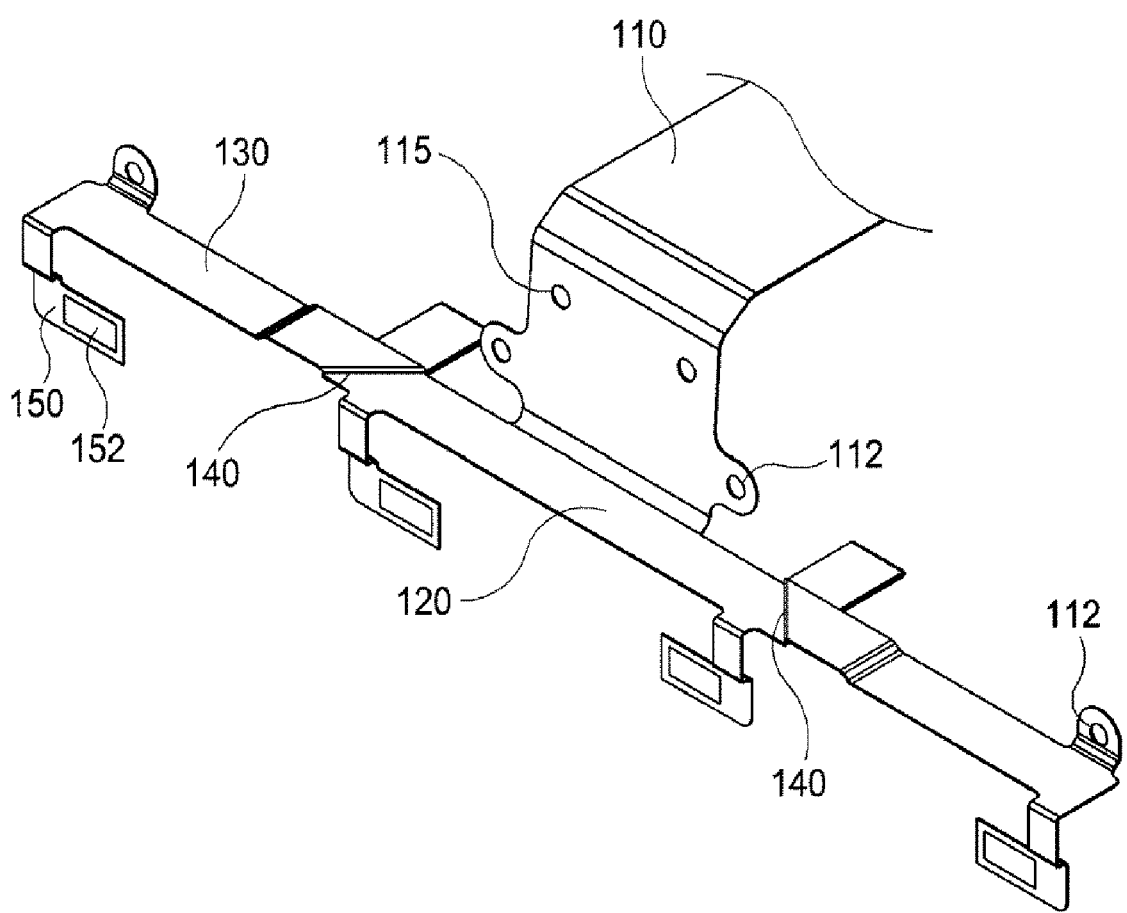
FIG. 7 is a perspective view showing a state in which the substrate layer of the third connection circuit portion shown in FIG. 4 is exposed.
Figure 8:
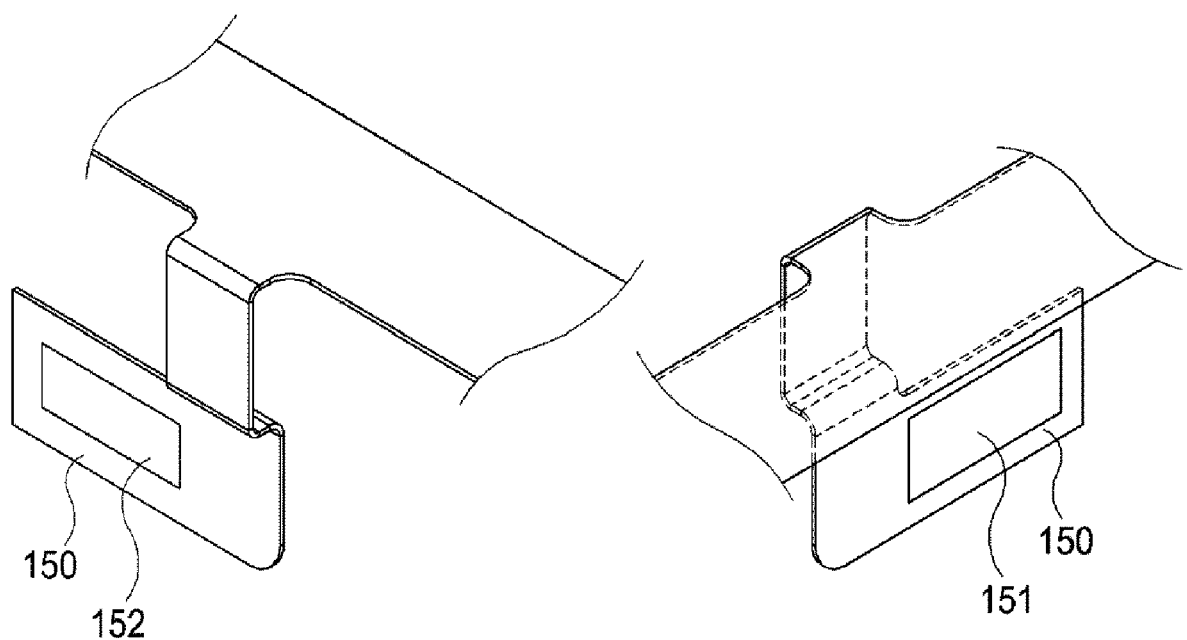
FIG. 8 is a plan view showing the first surface and the second surface shown in FIG. 7.

FIG. 7 is a perspective view showing a state in which the substrate layer of the third connection circuit portion 150 shown in FIG. 4 is exposed. FIG. 8 is a plan view showing the first surface 151 and the second surface 152 shown in FIG. 7. FIG. 9 is a sectional view showing a cross section of the third connection circuit portion 150 shown in FIG. 8.

The third connection circuit portion 150 is formed to extend from each of the first connection circuit portion 120 and the second connection circuit portion 130 so as to be branched from each of the first connection circuit portion 120 and the second connection circuit portion 130 and may be joined to a bus bar on one side thereof. In the flexible circuit board 100 according to one embodiment, the first connection circuit portion 120 may be formed with a plurality of third connection circuit portions 150 extending in the same direction. Furthermore, one third connection circuit portion 150 may be formed at the end of the second connection circuit portion 130.

The third connection circuit portions 150 may be disposed side by side in the same direction so that, in the state (third state) in which the second connection circuit portion 130 is disposed on the same line as the first connection circuit portion 120, the third connection circuit portion 150 formed in the second connection circuit portion 130 protrude in the same direction as the third connection circuit portions 150 formed in the first connection circuit portion 120.

The third connection circuit portion 150 may be connected to the bus bar and may measure the voltage and current of each of the battery cells and transmit the voltage and current as electrical information along the substrate layer 101. Accordingly, the number of the third connection circuit portions 150 may be increased or decreased according to the number of battery cells and the number of bus bars.

The third connection circuit portions 150 may be formed such that the internal substrate layer 101 of the flexible circuit board 100 is exposed on both side surfaces thereof. The substrate layer 101 may include a first surface 151 making contact with the bus bar and a second surface 152 formed and exposed on the opposite side of the first surface 151.

The size of the first surface 151 may be larger than the size of the second surface 152. Such a structure may facilitate joining of the first surface 151 and the bus bar, and may reduce the externally exposed portion of the substrate layer 101 to minimize damage to the substrate layer 101.

In another embodiment, the third connection circuit portion 150 may be formed such that one surface of the internal substrate layer 101 is exposed. The opposite surface of the substrate layer 101 may be covered with an insulating layer. In addition, one exhaust surface of the substrate layer 101 may make contact with the bus bar.

According to the above-described embodiment, the bus bar and the third connection circuit portion 150 may be directly joined to each other, thereby reducing the number of work steps and reducing the weight and cost. This will be explained in detail in the battery module description.

Hereinafter, specific embodiments of the battery module of the present disclosure including the above-described flexible circuit board will be described in detail with reference to the drawings.

First Embodiment

Figure 10:
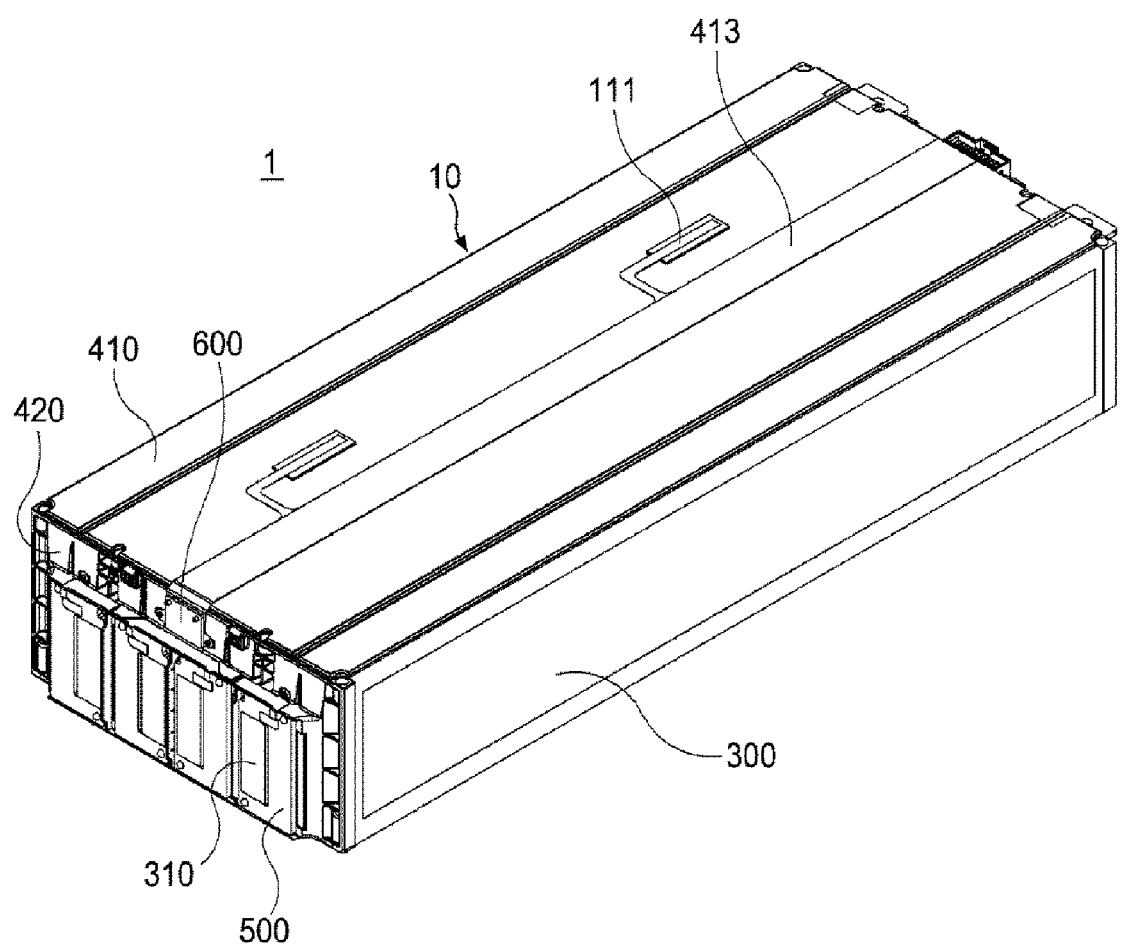
FIG. 10 is a perspective view of a battery module according to a first embodiment of the present disclosure.
Figure 11:
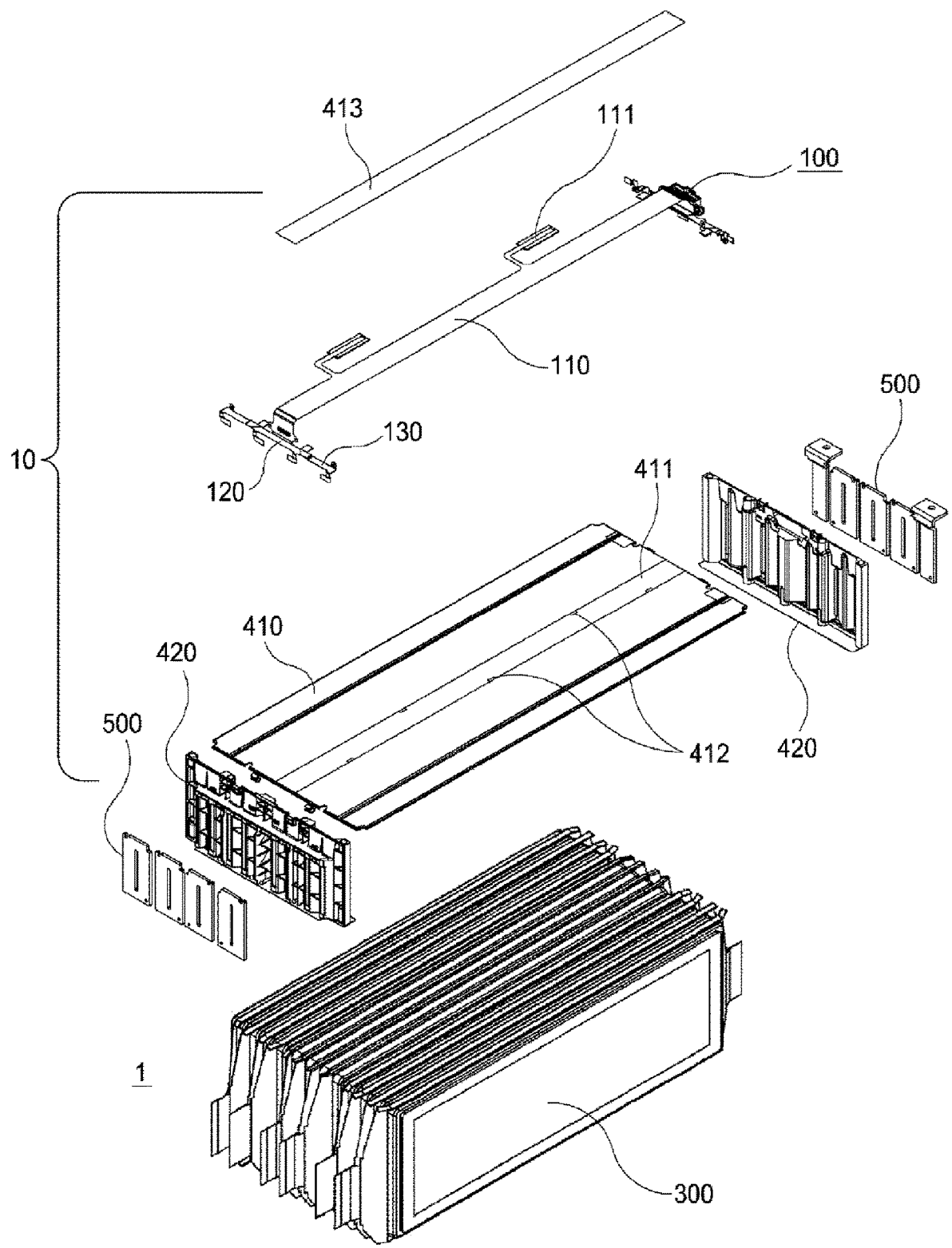
FIG. 11 is an exploded perspective view of the battery module shown in FIG. 10.
Figure 12:
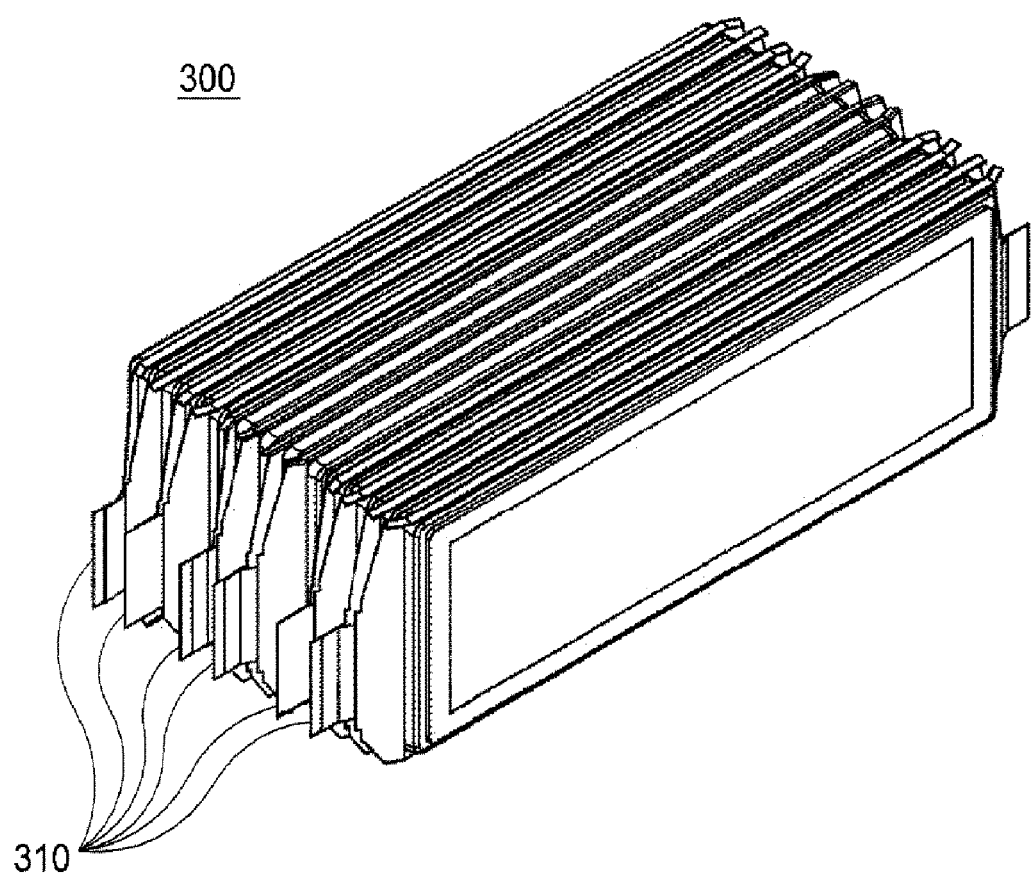
FIG. 12 is a perspective view of the cell assembly of the battery module shown in FIG. 10.
Figure 13:
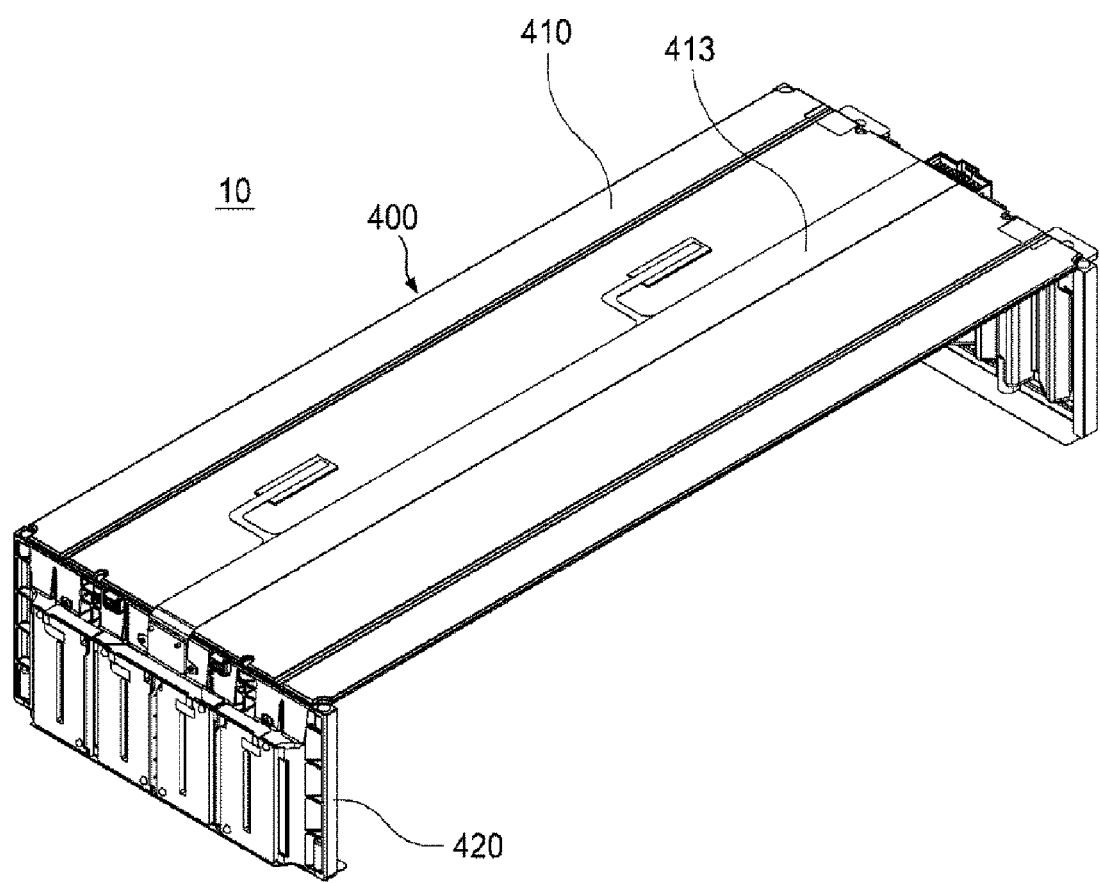
FIG. 13 is a perspective view of the frame assembly of the battery module shown in FIG. 10.
Figure 14:
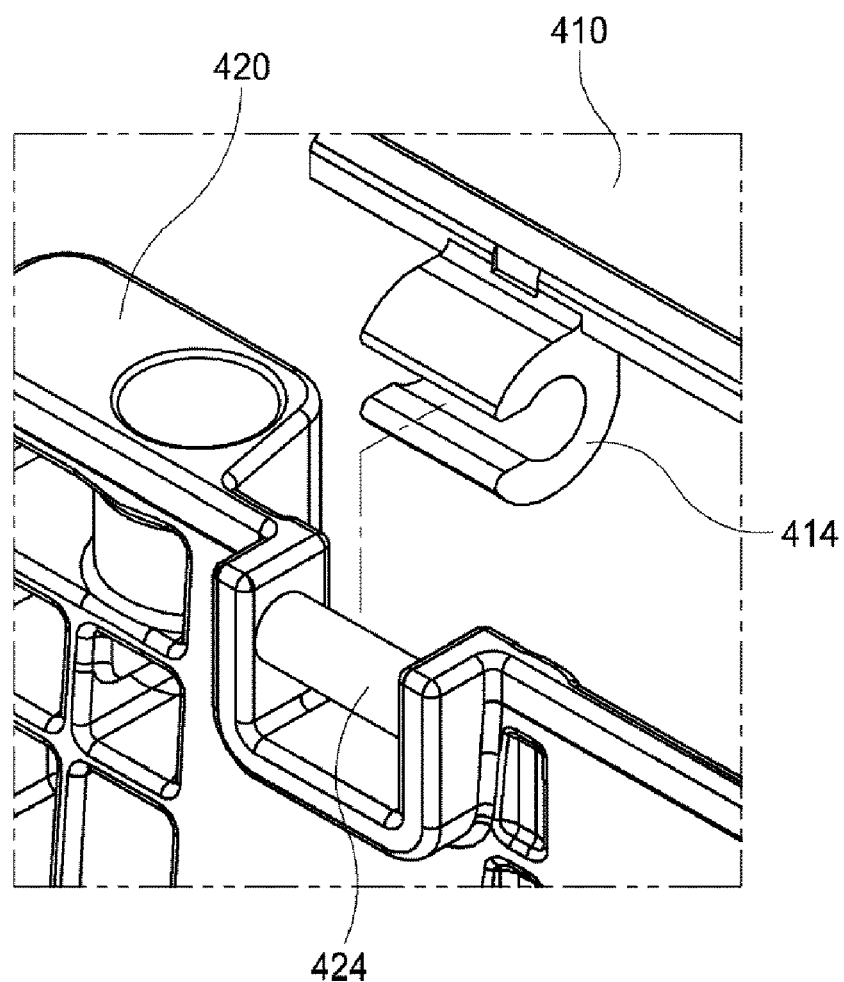
FIG. 14 is a perspective view showing a hinge coupling of the upper plate and the side plate of the frame shown in FIG. 13.

FIG. 10 is a perspective view of a battery module 1 according to a first embodiment of the present disclosure. FIG. 11 is an exploded perspective view of the battery module 1 shown in FIG. 10. FIG. 12 is a perspective view of the cell assembly 300 of the battery module 1 shown in FIG. 10. FIG. 13 is a perspective view of the frame assembly 10 of the battery module 1 shown in FIG. 10. FIG. 14 is a perspective view showing a hinge coupling of the upper plate 410 and the side plate 420 of the frame 400 shown in FIG. 13.

Referring to FIGS. 10 to 14, the battery module 1 according to a first embodiment of the present disclosure may include a cell assembly 300 formed by stacking one or more battery cells, and a frame assembly 10 for fixing the cell assembly 300.

The frame assembly 10 may include a frame 400 disposed to surround the cell assembly 300 and provided with an upper plate 410 and side plates 420 connected to both ends of the upper plate 410, bus bars 500 disposed on and fixed to the side plates 420, and a flexible circuit board 100 disposed along the upper plate 410 and the side plates 420 to sense voltages of the battery cells. The upper plate 410 may have a path groove 411 recessed at a predetermined depth on the upper surface of the upper plate 410.

The cell assembly 300 is formed by stacking one or more battery cells. The battery cells are usually formed of, but are not limited to, secondary batteries. The battery cells may be any rechargeable battery.

The battery cell protrudes on both sides to form terminal portions 310. When a (−) terminal is formed on one side, a (+) terminal is formed on the other side. Furthermore, it is preferable that the battery cell is formed of a conductive material and has flexibility so as to be deformable. Accordingly, the terminal portion 310 is folded to one side and electrically connected to the adjacent terminal portion 310 through a joining process.

As shown in FIG. 12, the cell assembly 300 may be formed by stacking battery cells in an erected form. The terminal portion 310 of the battery cell is connected to the terminal portion 310 of the adjacent battery cell. For example, when the terminals having the same polarity are connected to each other, the battery cells are electrically connected in parallel. When the terminals having different polarities are connected to each other, the battery cells are electrically connected in series.

The connection of the battery cells may be configured differently as needed. For example, a 4P/3S connection may be formed by connecting eight battery cells in parallel to form four pairs of battery cells and connecting the four pairs of battery cells in series.

According to the above-described embodiment, the battery capacity according to the vehicle package can be easily changed by changing the connection configuration of the battery cells in the cell assembly 300, and the time required for the joining process can be reduced, thereby improving the productivity.

Referring to FIGS. 13 and 14, the frame 400 may include an upper plate 410 and side plates 420 connected to both ends of the upper plate 410. The upper plate 410 and the side plates 420 of the frame 400 are hingedly coupled to each other using hook portions 414 formed in the upper plate 410 and rod portions 424 formed in the side plates 420.

A plurality of hook-shaped hook portions 414 may be formed at the ends of the upper plate 410 in a spaced-apart relationship with each other. Rod portions 424 may be formed on the upper surfaces of the side plates 420 in a corresponding relationship with the positions of the hook portions 414. The hook portions 414 and the rod portions 424 are formed to protrude from the upper plate 410 and the side plates 420 so as to face each other at one side so that the rod portions 424 can be fitted to and hingedly coupled to the hook portions 414.

In one embodiment, the inner radius of curvature of the hook portion 414 may be equal to or less than the radius of the rod portion 424. As a result, a predetermined fixing force can be secured when coupling the upper plate 410 and the side plates 420 can be secured. Therefore, the frame 400 can be prevented from being separated during the assembly process, thereby improving the workability.

The frame 400 may be disposed to surround the cell assembly 300 by disposing the upper plate 410 on the upper side of the cell assembly 300 and disposing the side plates 420 on both sides of the cell assembly 300 having the terminal portion 310.

In the frame 400, the upper plate 410 and the side plates 420 may be formed by injection molding a plastic. Accordingly, the frame 400 is low in production cost and can be easily assembled by hinge coupling.

Figure 15:
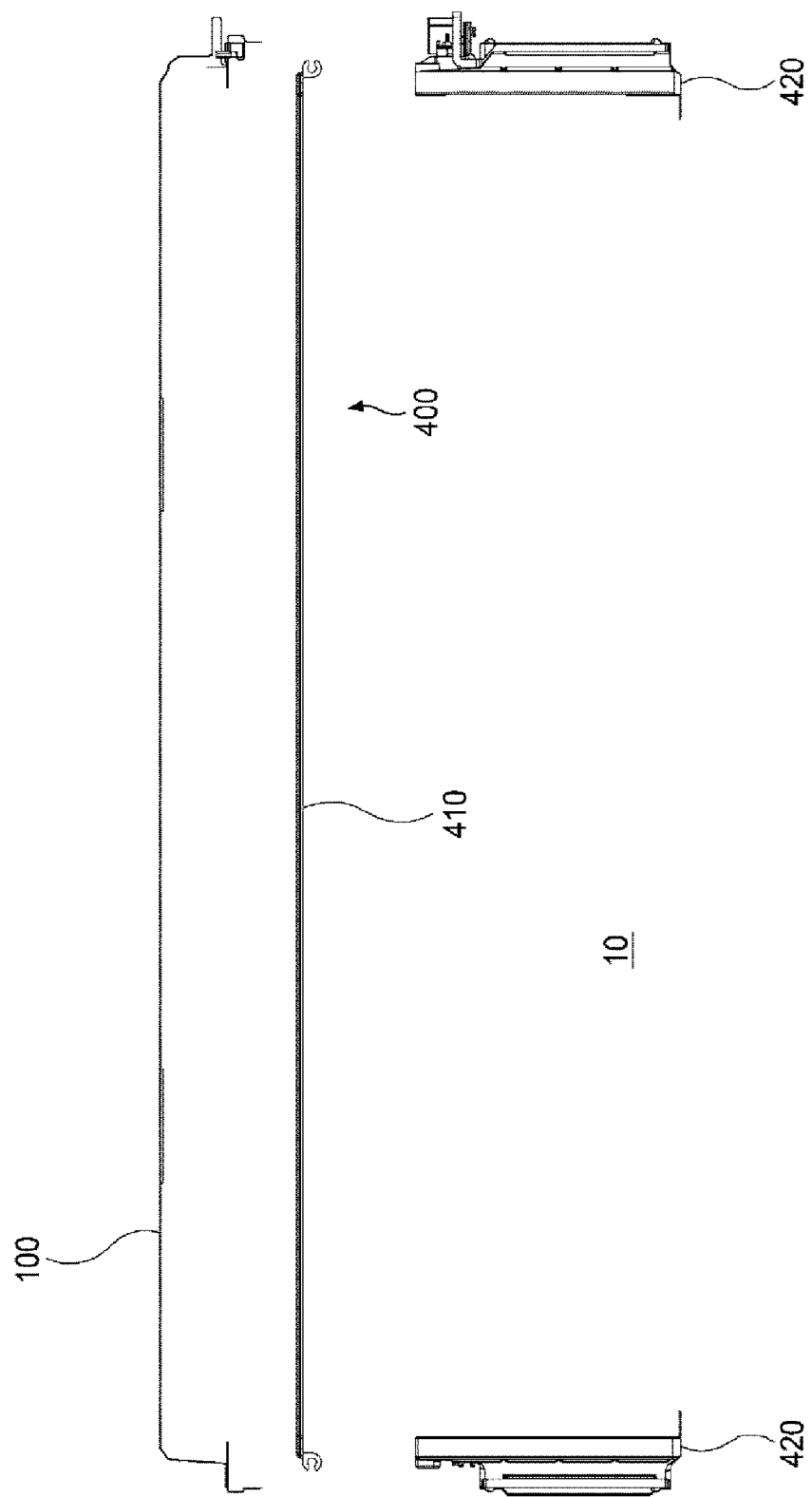
FIG. 15 is a side view showing the arrangement of the frame of the battery module shown in FIG. 10 and the flexible circuit board.
Figure 16:
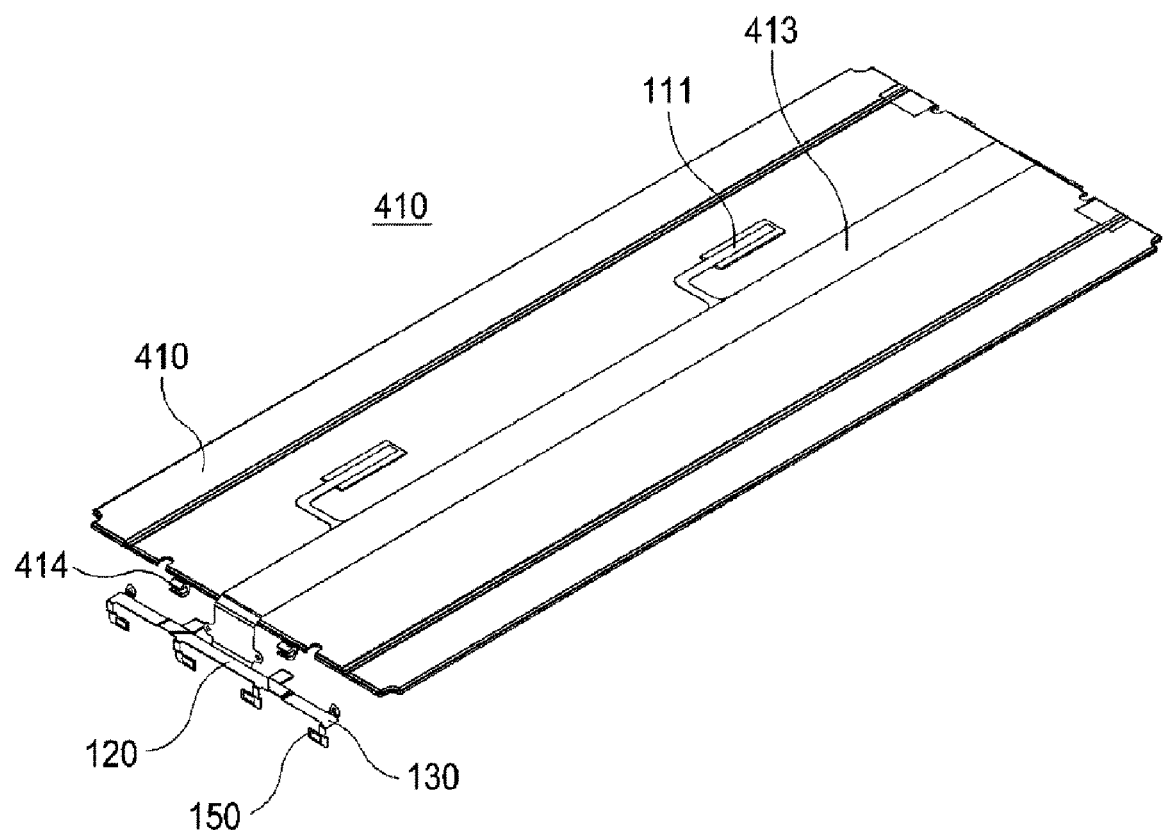
FIG. 16 is a perspective view showing a combined structure of the upper plate of the frame assembly shown in FIG. 13 and the flexible circuit board.
Figure 17:
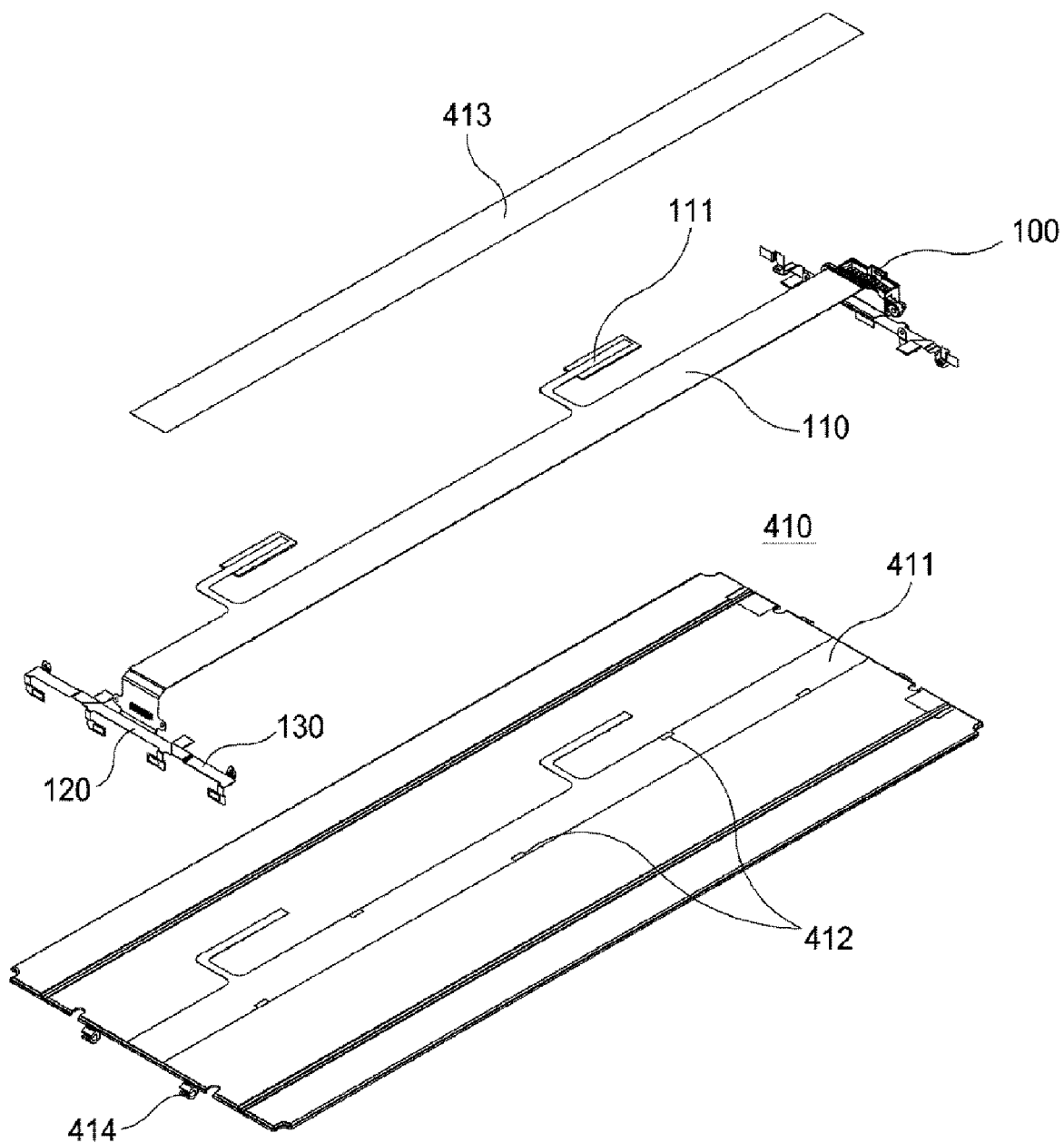
FIG. 17 is an exploded perspective view showing an exploded configuration of the upper plate shown in FIG. 16 and the flexible circuit board.
Figure 18:
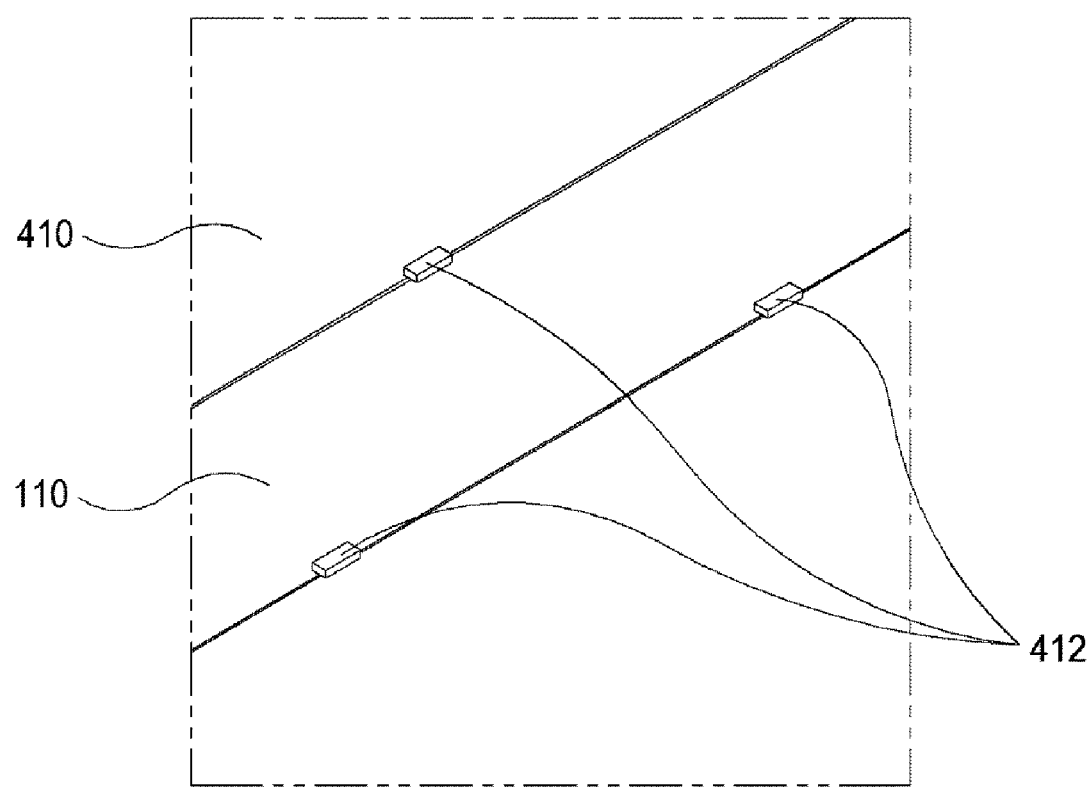
FIG. 18 is a plan view showing a state in which the flexible circuit board is seated in the path groove of the upper plate shown in FIG. 17.

FIG. 15 is a side view showing the arrangement of the frame 400 of the battery module 1 shown in FIG. 10 and the flexible circuit board 100. FIG. 16 is a perspective view showing a combined structure of the upper plate 410 of the frame assembly 10 shown in FIG. 13 and the flexible circuit board 100. FIG. 17 is an exploded perspective view showing an exploded configuration of the upper plate 410 shown in FIG. 16 and the flexible circuit board 100. FIG. 18 is a plan view showing a state in which the flexible circuit board 100 is seated in the path groove 411 of the upper plate 410 shown in FIG. 17.

Figure 19:
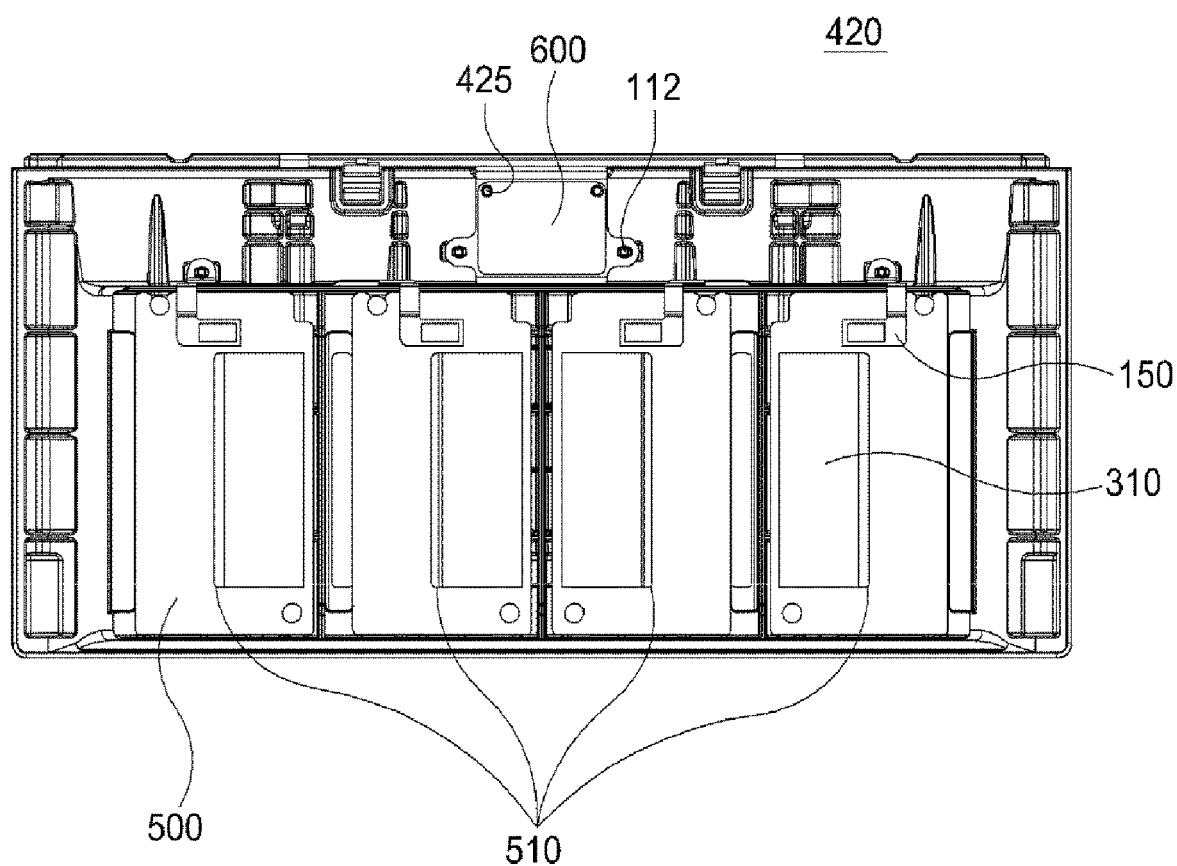
FIG. 19 is a front view of the side plate of the battery module shown in FIG. 10.
Figure 20:
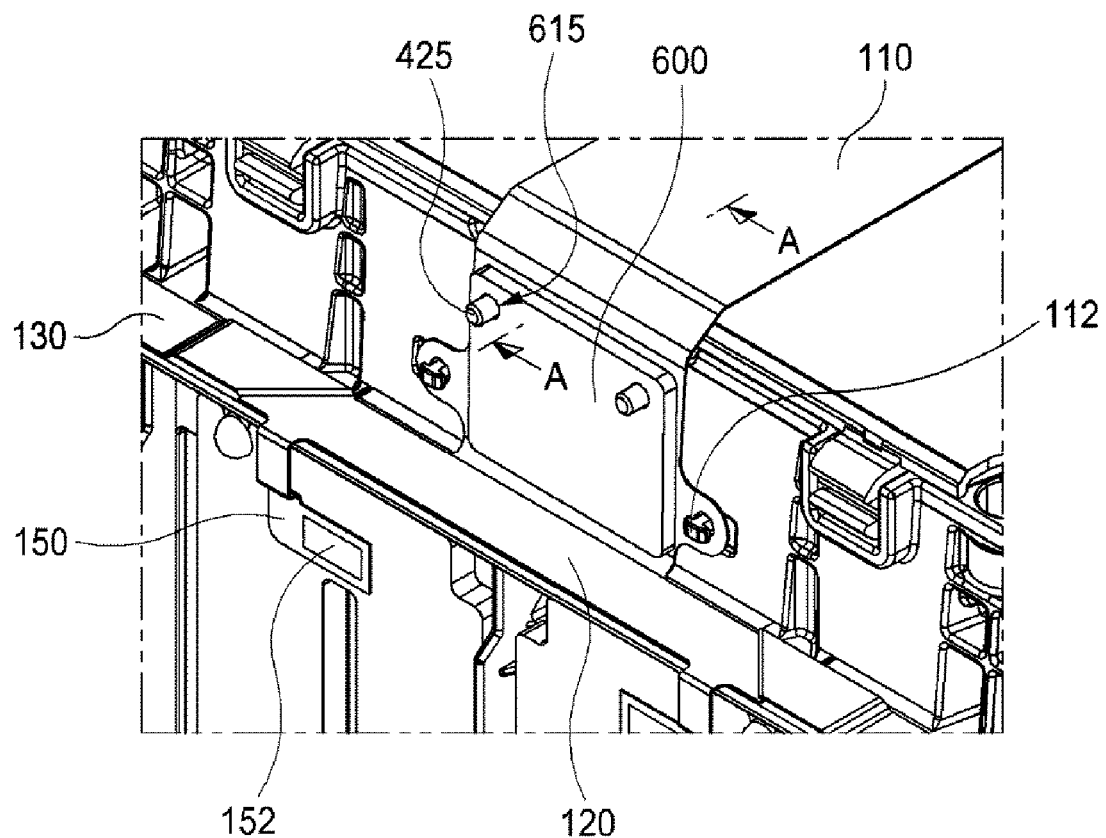
FIG. 20 is an enlarged perspective view showing the reinforcing plate shown in FIG. 19.
Figure 21:
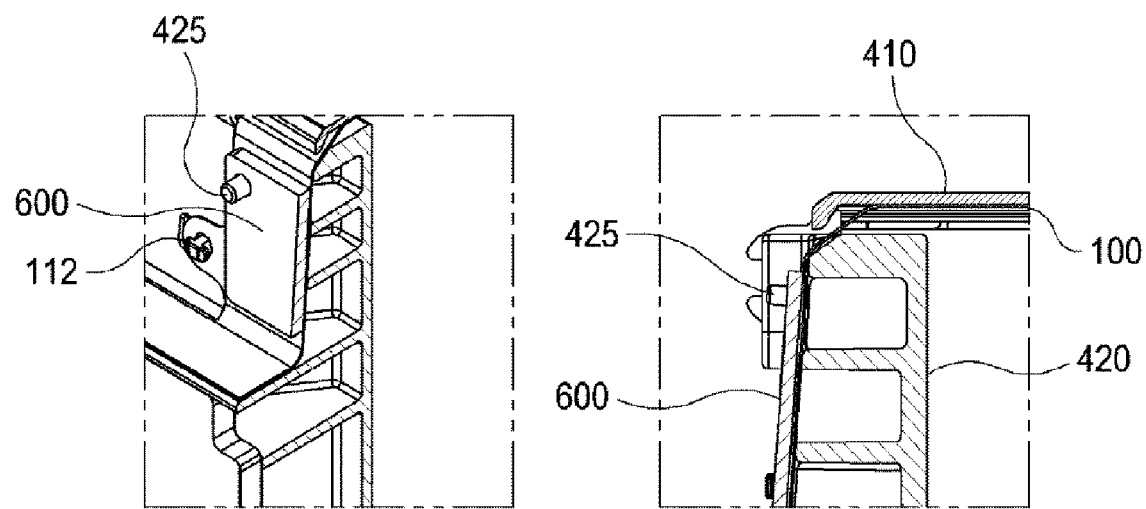
FIG. 21 is a sectional perspective view and a sectional view taken along line A-A in FIG. 20.
Figure 22:
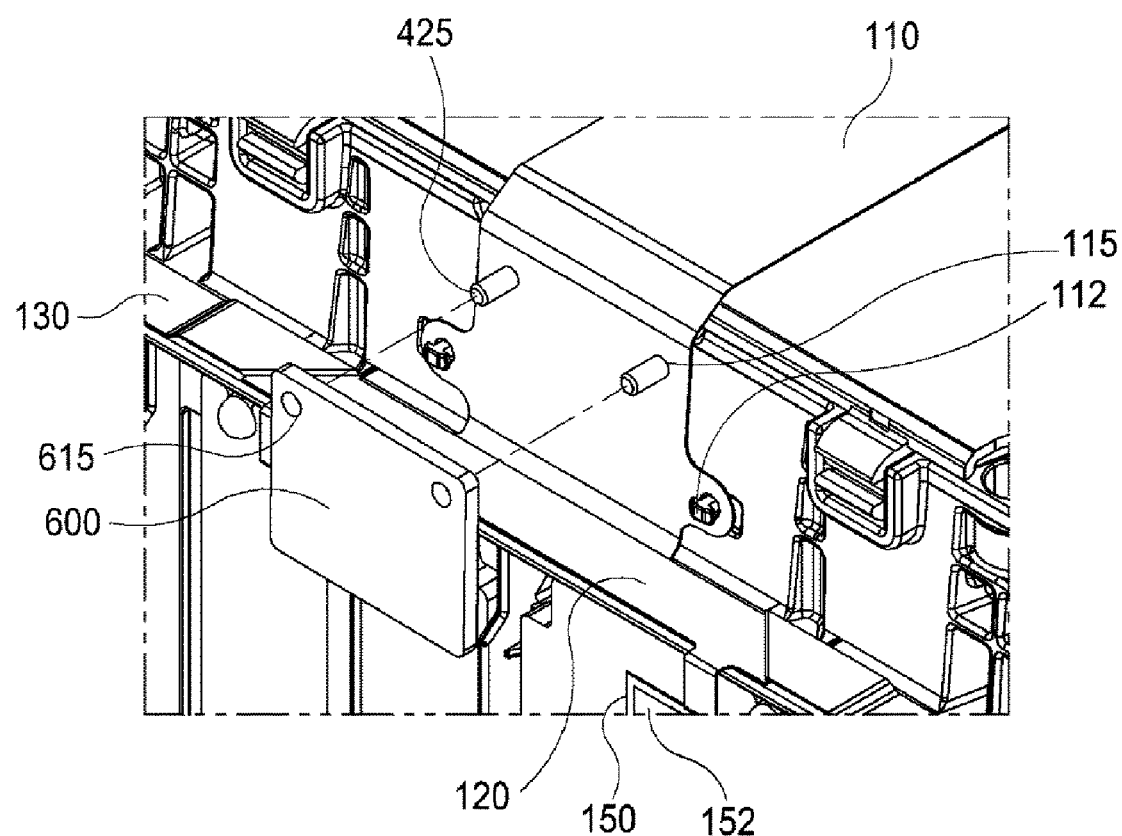
FIG. 22 is a view showing a fixing method of the reinforcing plate shown in FIG. 20.
Figure 23:
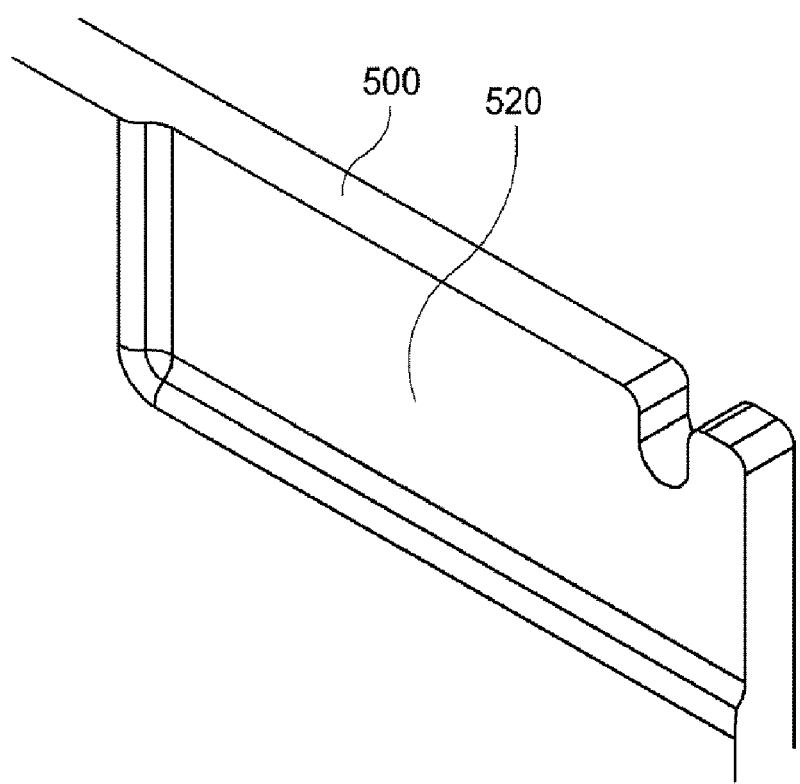
FIG. 23 is an enlarged perspective view of the seat portion of the bus bar shown in FIG. 19.

FIG. 19 is a front view of the side plate 420 of the battery module 1 shown in FIG. 10. FIG. 20 is an enlarged perspective view showing the reinforcing plate 600 shown in FIG. 19. FIG. 21 is a sectional perspective view and a sectional view taken along line A-A in FIG. 20. FIG. 22 is a view showing a fixing method of the reinforcing plate 600 shown in FIG. 20. FIG. 23 is an enlarged perspective view of the seat portion 520 of the bus bar 500 shown in FIG. 19.

As shown in FIG. 15, the flexible circuit board 100 is disposed along the outer side of the frame 400. The central portion 110 may be disposed on the upper surface of the upper plate 410. The central portion 110 is seated on and fixed to the path groove 411 recessed at a predetermined depth. The length of the center portion 110 is larger than the length of the upper plate 410. Both ends of the central portion 110 may be bent along the side plates 420.

The first connection circuit portion 120 and the second connection circuit portion 130 are disposed on the outer side of the side plate 420 and are bent to make close contact with the outer surface of the side plate 420. Accordingly, the third connection circuit portions 150 formed in the first connection circuit portion 120 and the second connection circuit portion 130 may be structurally disposed outside the bus bar 500.

Referring to FIG. 2, protrusion holes 112 may be formed in the central portion 110 and the second connection circuit portion 130. The protrusion holes 112 are provided in plural, fastening members (not shown) may be inserted into the protrusion holes 112 to fix the flexible circuit board 100 to the frame 400. The protrusion holes 112 are formed so as to protrude outward and, therefore, do not affect the internal circuit.

One end of the flexible circuit board 100 is electrically connected to the bus bar 500. A plurality of wires are arranged in parallel inside the bus bar 500 to transmit information on the voltage and current of the battery cells to a battery management system (BMS) (not shown). The BMS manages the charging and discharging of each battery cell. For example, in a charging mode, the BMS may charge a plurality of battery cells discharged at different voltage levels, so as to have a uniform voltage level.

The upper plate 410 is formed in a rectangular shape corresponding to the size of the cell assembly 300 and is disposed on the upper side of the cell assembly 300. A path groove 411 in which the central portion 110 is seated is formed on the upper surface of the upper plate 410. The upper plate 410 includes a top cover 413 that covers the upper side of the path groove 411.

The path groove 411 may be formed to have a predetermined depth so that the central portion 110 can be seated in the path groove 411. The top cover 413 may cover the upper side of the central portion 110 in a state in which the central portion 110 is seated in the path groove 411. Therefore, the path groove 411 and the top cover 413 may be formed in the same shape as the shape of the central portion 110. Accordingly, the central portion 110 is prevented from being removed to the outside of the frame 400 and from being exposed to the outside. This makes it possible to avoid damage that may occur in the central portion 110 during the assembly process.

Ribs 412 protruding toward the inside of the path groove 411 may be formed in the upper plate 410. The ribs 412 may be alternately formed on both sides of the path groove 411 and may be spaced apart from each other by a predetermined distance.

The ribs 412 may be formed to protrude inwardly from both sides of the path groove 411 and the lower surface of the rib 412 may be spaced apart from the path groove 411 at a predetermined interval. Therefore, the central portion 110 is disposed between the ribs 412 and the path groove 411 and is prevented from being removed from the path groove 411. Thus, the flexible circuit substrate 100 can be closely fixed to the frame 400 without having to use an adhesive such as a double-sided tape or the like.

Referring to FIG. 19, the reinforcing plate 600 and the bus bar 500 may be closely fixed to the outer surface of each of the side plates 420. Two side plates 420 are connected to both ends of the upper plate 410, respectively. Thus, the two side plates 420 may be disposed on both side surfaces of the cell assembly 300. Both side surfaces of the cell assembly 300 may be both sides where the terminal portions 310 of the battery cells are formed.

The reinforcing plate 600 may cover the end of the central portion 110 and may be closely fixed to each of the side plates 420. Each of the side plates 420 may be provided with fusion protrusions 425 protruding from each of the side plates 420 for fixing the reinforcing plate 600. Fixing holes 115 and 615 may be formed in the central portion 110 and the reinforcing plate 600 in a corresponding relationship with the positions of the fusion protrusions 425, respectively.

The reinforcing plate 600 may be fixed by a fusion method after the fusion protrusions 425 sequentially pass through the first fixing holes 115 of the central portion 110 and the second fixing holes 615 of the reinforcing plate 600. In a thermal fusion process, the fusion protrusions 425 are melted down from the outside and compressed by a pressing member (not shown) provided with a heater. Thereafter, the compressed portions of the fusion protrusions 425 are cooled and hardened so that the reinforcing plate 600 can be brought into close contact with each of the side plates 420.

According to the above-described embodiment, the end of the central portion 110 may be disposed and fixed between the reinforcing plate 600 and each of the side plates 420. Since the reinforcing plate 600 moves beyond the bent portion of the central portion 110 and presses the lower end portion of the central portion 110, it is possible to minimize the additional bending of the flexible circuit board 100 by pressurization. This makes it possible to prevent occurrence of damage such as cracks or the like In addition, it is possible to prevent the flexible circuit board 100 from being directly pressed in the thermal fusion process and to absorb external forces such as continuous vibrations or impacts caused by the driving of a vehicle, thereby minimizing damage.

The fusion process referred to herein may include not only a thermal fusion process but also an ultrasonic fusion process.

The reinforcing plate 600 may be made of any circuit-less insulating material except for metal so as not to hinder the electrical connection between the flexible circuit board 100 and the bus bar 500.

The bus bar 500 may be closely fixed to each of the side plates 420. A portion of the bus bar 500 may be connected to the third connection circuit portion 150 and the other portion thereof may be connected to the terminal portion 310. Therefore, the bus bar 500 may be configured to electrically connect the flexible circuit board 100 and the battery cells.

There may be provided a plurality of bus bars 500 may be provided in a spaced-apart relationship with each other. The number of the bus bars 500 may be changed as needed. In addition, insertion holes 510 and seat portions 520 may be formed in each of the bus bars 500.

The seat portions 520 may be portions of each of the bus bars 500, which are joined to the third connection circuit portions 150 of each of the bus bars 500, and may be formed to have a predetermined depth. Therefore, a worker is capable of visually recognizing a working position based on the seat portions 520 and is capable of clearly grasping a joining position. As a result, it is possible to solve problems such as defective joining and the like.

The insertion holes 510 may be formed along the same direction as the stacking direction of the battery cells. The terminal portions 310 of the cell assembly 300 are inserted into the insertion holes 510. The portions of the terminal portions 310 protruding through the insertion holes 510 may be folded to one side and may be joined to each of the bus bars 500. Accordingly, the battery cells may be electrically connected to other battery cells through each of the bus bars 500.

At this time, holes (not shown) may also be formed in the side plates 420 in a corresponding relationship with the positions where the insertion holes 510 are formed for the insertion of the terminal portions 310.

The bus bars 500 may include a sensing bus bar and an HV bus bar which are formed independently of each other. The bus bars 500 may be electrically connected to the terminal portions 310 of the cell assembly 300 to transmit information on the voltage and current of each battery cell or may be connected to the bus bars provided outside the battery module 1 to transmit electrical information. In addition, the bus bars 500 may be made of a conductor and may be made of metal having high electrical conductivity.

Figure 24:
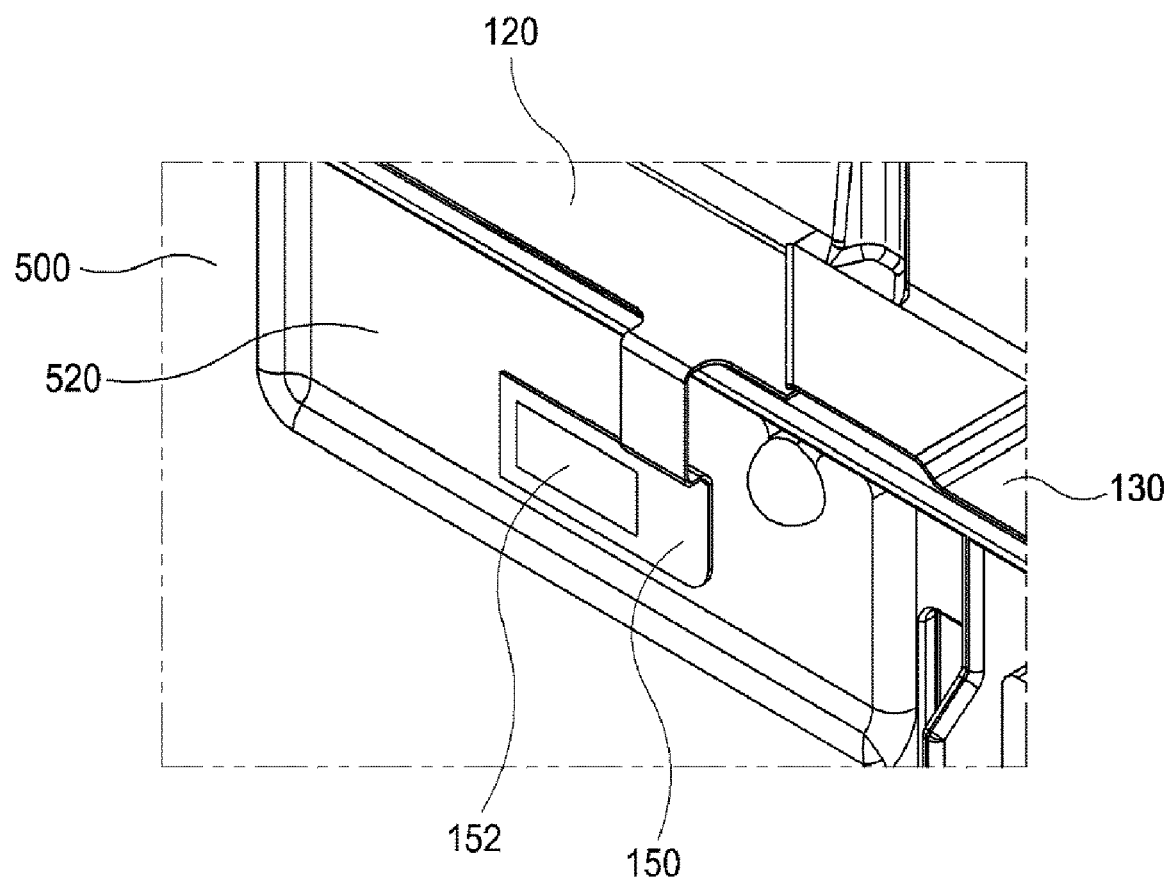
FIG. 24 is a front view showing a state in which the substrate layer is directly bonded to the seat portion shown in FIG. 23.
Figure 25:
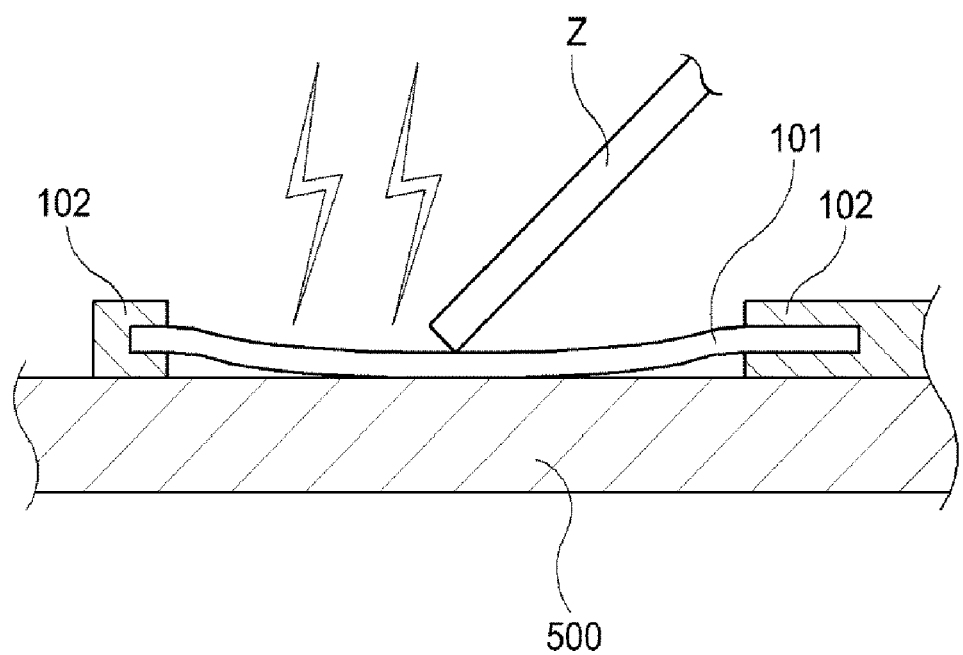
FIG. 25 is a sectional view showing a bonding method for bonding the substrate layer shown in FIG. 24 to the bus bar.
Figure 26:
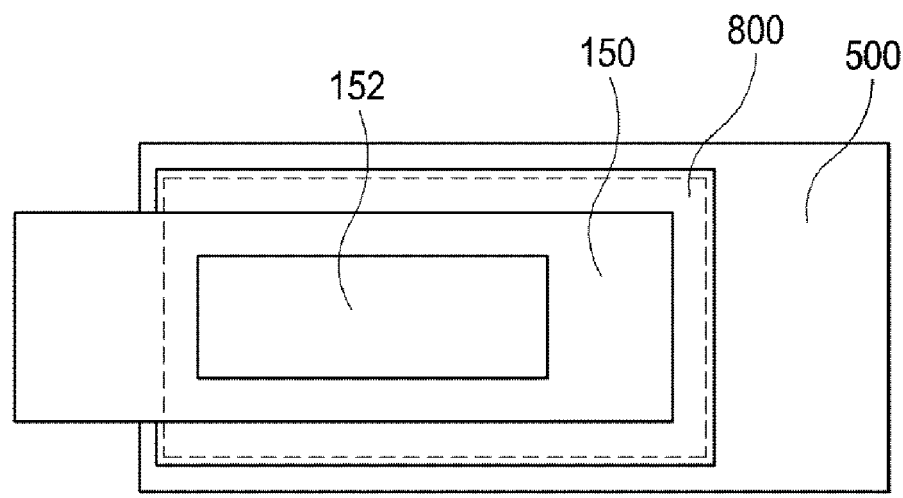
FIG. 26 is a plan view showing a state in which a coating portion is further formed on the third connection circuit portion shown in FIG. 24.
Figure 27:
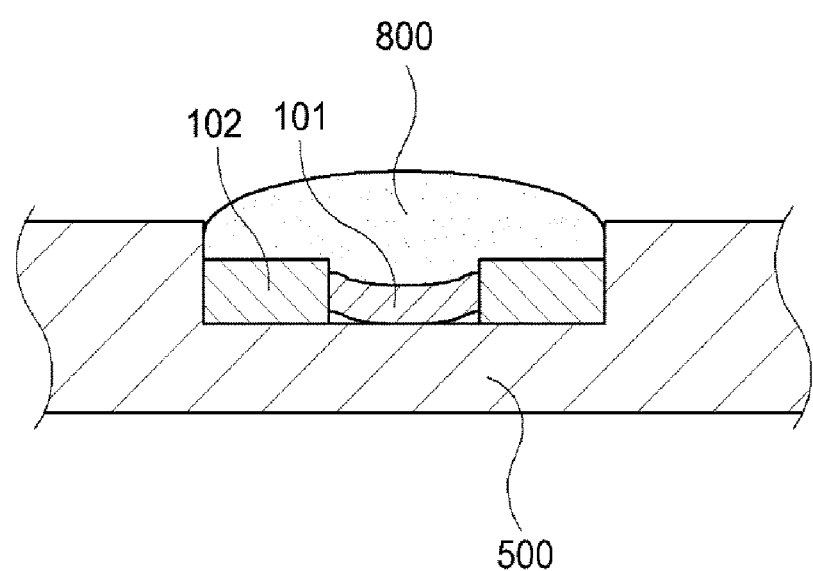
FIG. 27 is a sectional view of the coating layer shown in FIG. 26.

FIG. 24 is a front view showing a state in which the substrate layer 101 is directly bonded to the seat portion 520 shown in FIG. 23. FIG. 25 is a sectional view showing a bonding method for bonding the substrate layer 101 shown in FIG. 24 to the bus bar 500. FIG. 26 is a plan view showing a state in which a coating portion 800 is further formed on the third connection circuit portion 150 shown in FIG. 24. FIG. 27 is a sectional view of the coating layer shown in FIG. 26.

The substrate layer 101 may include a first surface 151 configured to make contact with the bus bar 500 and a second surface 152 formed on the opposite side of the first surface 151. A coating portion 800 may be further formed on the outer side of the second surface 152. The first surface 151 and the second surface 152 may be formed by cutting the insulating layers 102 of the flexible circuit substrate 100 to expose the internal substrate layer 101.

The first surface 151 may be in contact with one side of the bus bar 500 and may make contact the seat portion 520 recessed at a predetermined depth in the bus bar 500. The seat portion 520 clearly indicates the position where the third connection circuit portion 150 is joined. This makes it possible to improve the workability.

In one embodiment, the size of the first surface 151 may be larger than the size of the second surface 152. According to this embodiment, it is possible to secure a welding area over which the substrate layer 101 is welded to the bus bar 500 and to reduce the area of the substrate layer exposed to the outside, thereby preventing the third connection circuit portion 150 from being damaged.

The substrate layer 101 is configured to serve as a circuit of the flexible circuit board 100 and is made of an electrically conductive material. The substrate layer 101 may electrically connect the bus bar 500 and the flexible circuit board 100 by directly joining the first surface 151 and the seat portion 520. In this process, the first surface 151 may be joined by performing laser welding outside the second surface 152.

The first surface 151 may be an exposed surface formed by cutting the insulating layer 102. If there is an air gap corresponding to the outside of the seat portion 520 and the thickness of the insulating layer 102, the substrate layer 101 may be blackened in the joining process due to the air gap, or the insulating layers 102 may be burned. Thus, the required quality may not be achieved.

According to one embodiment, the air gap existing between the first surface 151 and the seat portion 520 may be removed by pressing the second surface 152 with a jig Z in the joining process. In addition, the contact area between the seat portion 520 and the first surface 151 is increased by the pressing operation. This makes it possible to enhance the fixing force of the welded portion.

Since the third connection circuit portion 150 is configured to be exposed on both sides of the substrate layer 101, the third connection circuit portion 150 may have a structure that can be directly coupled to the bus bar 500. Therefore, it is possible to reduce the number of parts to be used and to reduce the number of work steps, thereby improving the productivity.

The coating portion 800 may be formed to cover the second surface 152 and a portion of the bus bar 500 around the third connection circuit portion 150. The coating portion 800 may be made of a nonconductive material so as not to hinder the electrical connection between the substrate layer 101 and the bus bar 500, and may be applied to only a part of the bus bar 500 using a nozzle.

As shown in FIG. 27, the coating portion 800 may be formed in a state in which the first surface 151 is joined to the bus bar 500. Furthermore, the coating portion 800 may be formed to cover a portion of the insulating layer 102 and a portion of the bus bar 500. This makes it possible to prevent corrosion of the substrate layer 101 and to improve the joining strength with the bus bar 500.

Figure 28:
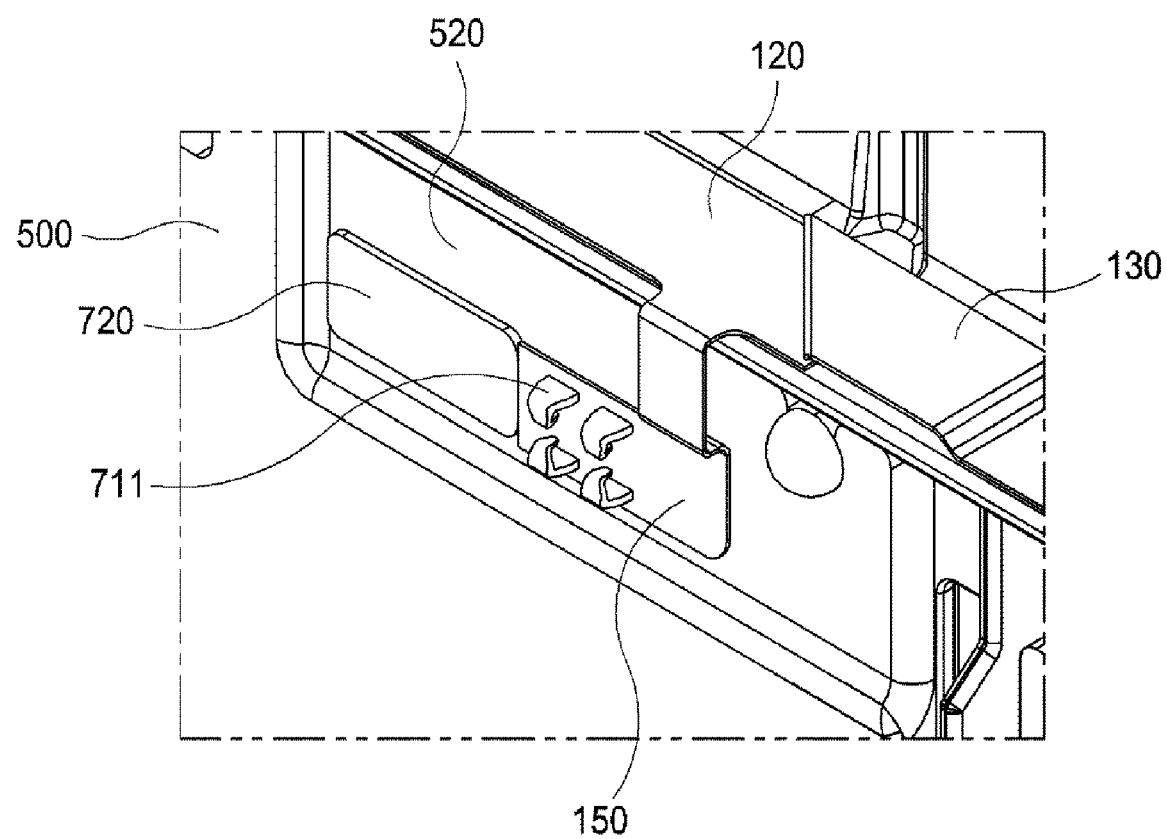
FIG. 28 is a front view showing a state in which the connecting portion of the integral connection terminal according to one embodiment is joined to the seat portion shown in FIG. 23.
Figure 29:
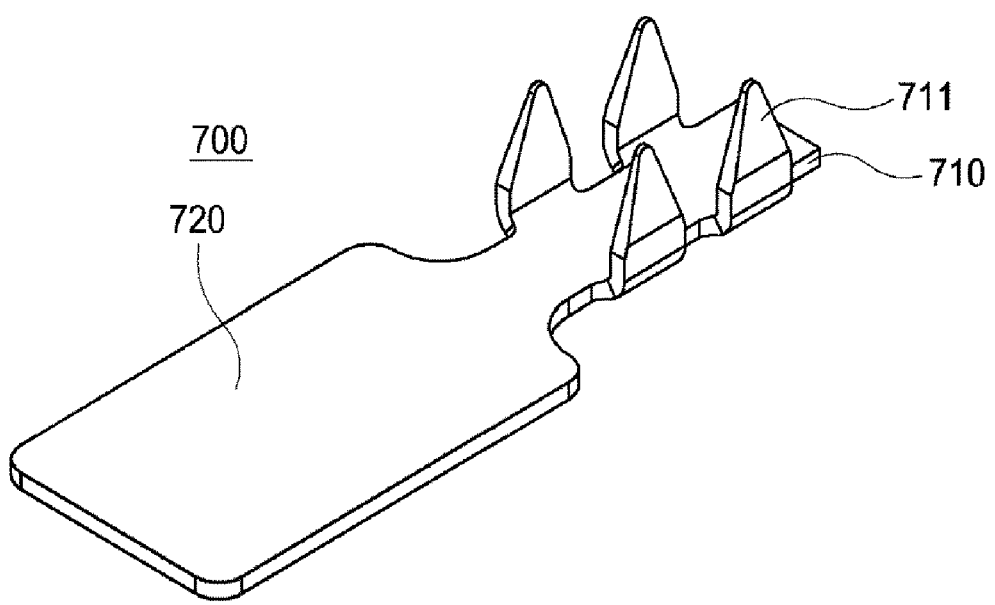
FIG. 29 is a perspective view of the integral connection terminal according to one embodiment shown in FIG. 28.
Figure 30:
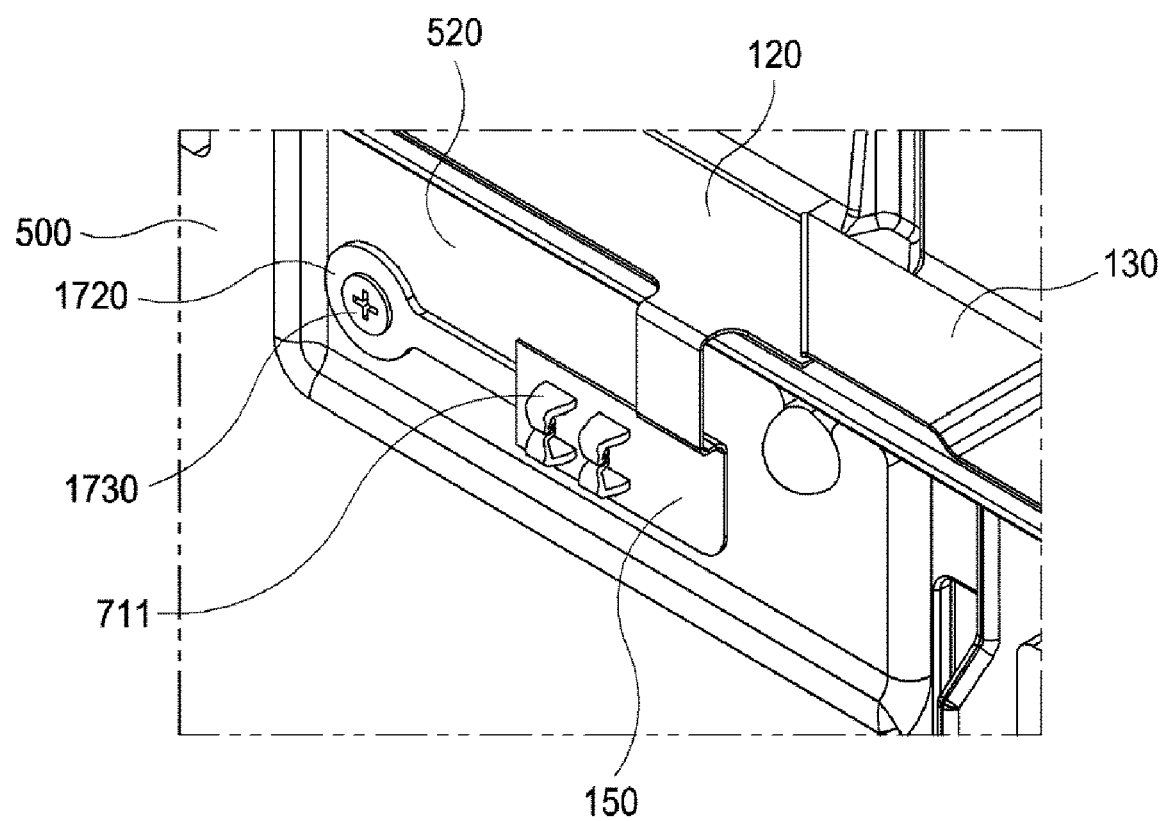
FIG. 30 is a front view showing a state in which the connecting portion of a ring-shaped connection terminal different from the integral connection terminal is joined to the seat portion shown in FIG. 23.
Figure 31:
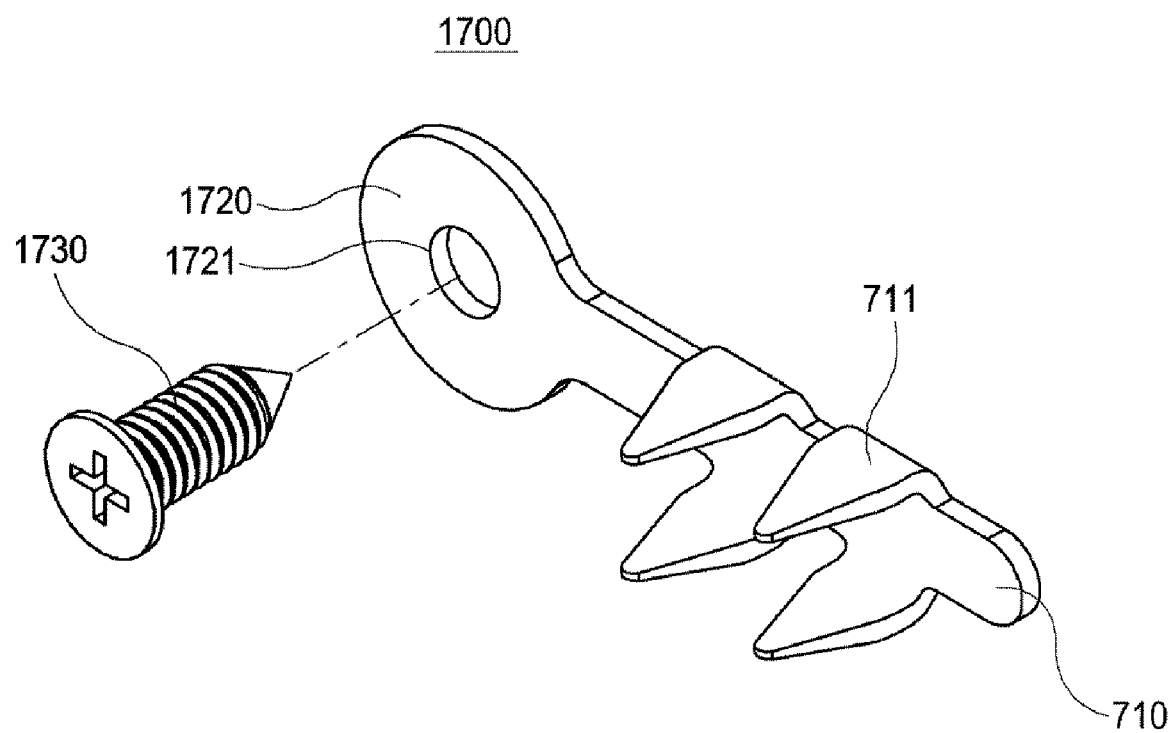
FIG. 31 is a perspective view of the ring-shaped connection terminal shown in FIG. 30 and the fastening member.

FIG. 28 is a front view showing a state in which the connecting portion 720 of the integral connection terminal 700 according to one embodiment is joined to the seat portion 520 shown in FIG. 23. FIG. 29 is a perspective view of the integral connection terminal 700 according to one embodiment shown in FIG. 28. FIG. 30 is a front view showing a state in which the connecting portion 1720 of a ring-shaped connection terminal 1700 different from the integral connection terminal 700 is joined to the seat portion 520 shown in FIG. 23. FIG. 31 is a perspective view of the ring-shaped connection terminal 1700 shown in FIG. 30 and the fastening member 1730. FIG. 32 is a perspective view showing a method in which the fixing portion 710 shown in FIGS. 28 and 30 is fixed to the third connection circuit portion 150.

The flexible circuit board 100 and the bus bar 500 may be electrically connected by the substrate layer 101 formed in the third connection circuit portion 150 as described in the above embodiment. Alternatively, the flexible circuit board 100 and the bus bar 500 may be electrically connected by the connection terminals 700 and 1700 connected to the third connection circuit portion 150 and the bus bar 500.

The connection terminal 700 or 1700 includes a fixing portion 710 and a connecting portion 720 or 1720. The connecting portion 720 or 1720 is integrally formed with the fixing portion 710 to extend from one side of the fixing portion 710. The connection terminal 700 or 1700 may be located between the bus bar 500 and the third connection circuit portion 150 and may be connected to the bus bar 500 and the third connection circuit portion 150 to electrically connect them.

Specifically, the fixing portion 710 may be fixed to the third connection circuit portion 150 and may be formed to have a relatively small width. The fixing portion 710 may be provided with fixing protrusions 711 protruding upward and downward. The fixing protrusions 711 are provided so as to be spaced apart from each other and may pass through the third connection circuit portion 150 arranged at a predetermined position. The end portions of the fixing protrusions 711 are bent and fixed to the third connection circuit portion 150.

The connection terminal 700 or 1700 may have various shapes. Hereinafter, the same reference numerals will be used to denote the same parts even if they correspond to different embodiments.

As shown in FIG. 25, the connecting portion 720 of the connection terminal 700 according to one embodiment is joined to the seat portion 520 of the bus bar 500 and is formed to have a relatively large width. The connecting portion 720 may be joined by laser welding. As shown in FIG. 27, the connecting portion 1720 of the connection terminal 1700 according to another embodiment may have a ring shape having a hole 1721 formed at the center thereof. The ring-shaped portion may be fixed by a fastening member 1730 such as a screw or the like.

In the connection terminal 700 or 1700 according to the above-described embodiment, unlike the prior art in which a fixing terminal and a connection plate are used to connect a flexible circuit board and a bus bar, the fixing portion 710 and the connecting portion 720 or 1720 are integrally connected to each other. This makes it possible to reduce the number of work steps and to reduce the manufacturing cost, thereby improving the productivity.

Figure 33:
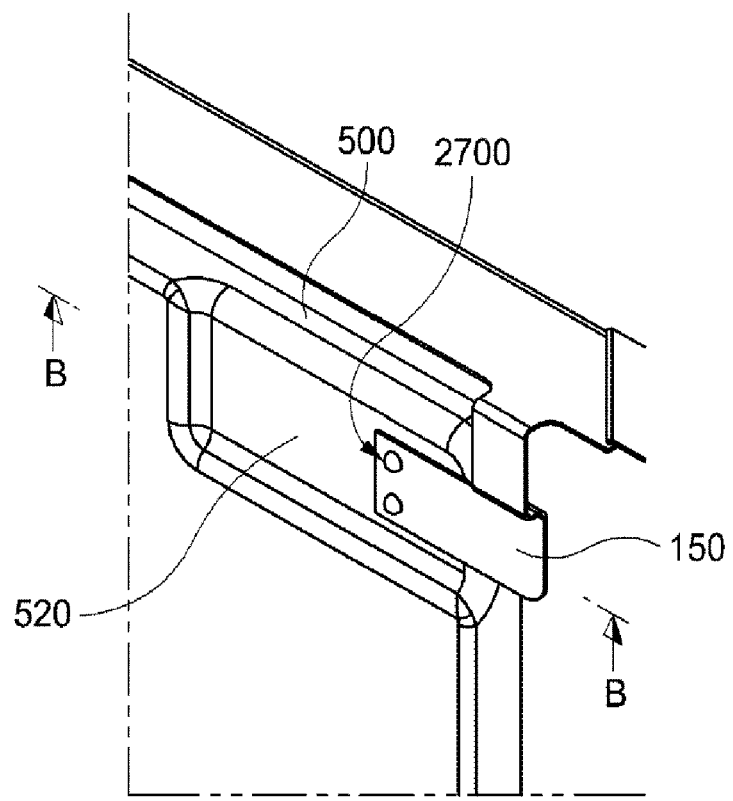
FIG. 33 is a perspective view showing a state in which a coupling member is coupled to the seat portion shown in FIG. 23.
Figure 34:
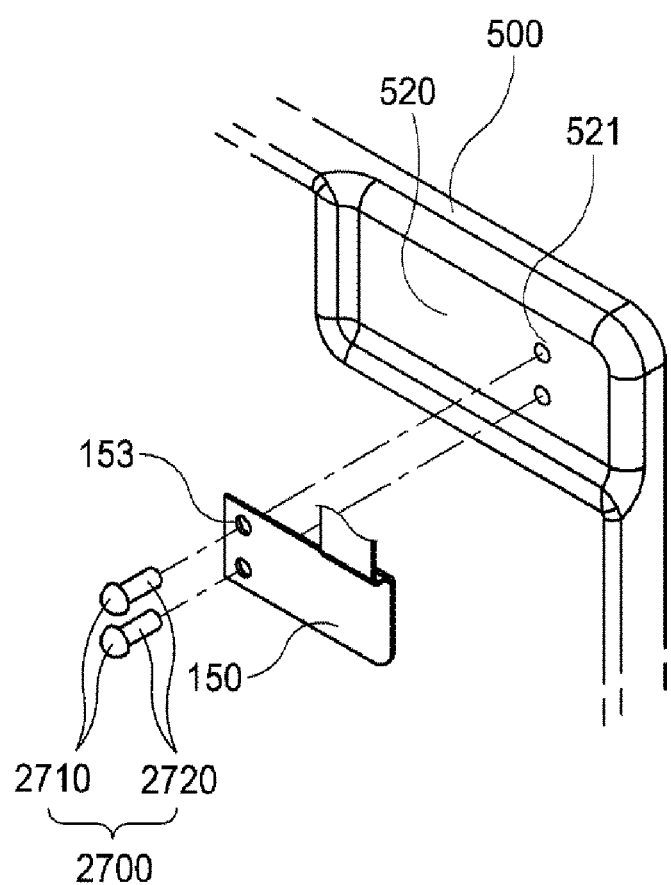
FIG. 34 is a perspective view showing a coupling method for coupling the coupling member to the seat portion shown in FIG. 33.
Figure 35:
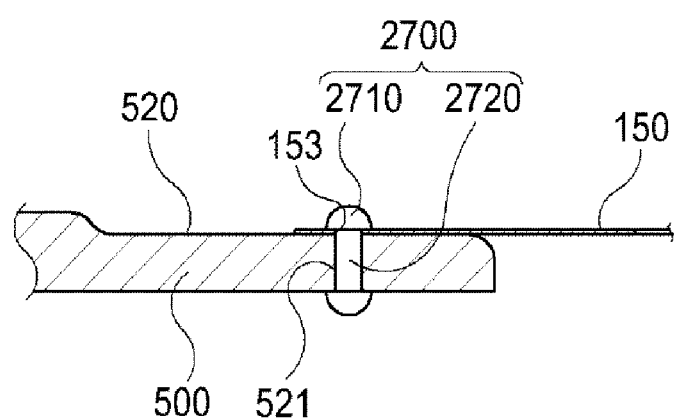
FIG. 35 is a sectional view taken along line B-B in FIG. 33.

FIG. 33 is a perspective view showing a state in which a coupling member 2700 is coupled to the seat portion 520 shown in FIG. 23. FIG. 34 is a perspective view showing a coupling method for coupling the coupling member 2700 to the seat portion 520 shown in FIG. 33. FIG. 35 is a sectional view taken along line B-B in FIG. 33.

The flexible circuit board 100 and the bus bar 500 can be electrically connected to each other by the substrate layer 101 formed in the third connection circuit portion 150 or the connection terminal 700 or 1700 as described above. However, a coupling member 2700 may be doubly joined between the third connection circuit portion 150 and the bus bar 500 to electrically connect the third connection circuit portion 150 and the bus bar 500.

The coupling member 2700 may include a head 2710 disposed outside the third connection circuit portion 150 and a joint portion 2720 extending from the head 2710. The joint portion 2720 may electrically connect the flexible circuit board and the bus bar. Accordingly, the coupling member 2700 is made of metal material having electrical conductivity. The head 2710 protrudes outward from the joint portion 2720 to press the third connection circuit portion 150 toward the seat portion 520, thereby fixing the third connection circuit portion to the seat portion 520.

A first coupling hole 521 may be formed in the seat portion 520 so that the coupling member 2700 can be coupled with the first coupling hole 521, and a second coupling hole 153 may be formed in the third coupling circuit portion 150 in correspondence with the position of the first coupling hole 521. A pair of first coupling holes 521 and a pair of second coupling holes 153 may be formed in a spaced-apart relation with each other and formed into a pair and may have the same inner diameter. The joint portion 2720 may be fixed to the bus bar 500 through the second coupling hole 153 and the first coupling hole 521 when the coupling member 2700 is coupled. In addition, the head 2710 is formed to extend outward from the joint portion 2720 and is disposed to protrude outside the third connection circuit portion 150.

The joint portion 2720 may be formed to have the same size as the first coupling hole 521 and the second coupling hole 153, and the head 2710 may have a radius larger than the radius of the joint portion 2720. Therefore, the head 2710 may be disposed outside the third connection circuit portion 150 without passing through the first coupling hole 521 and the second coupling hole 153.

According to the above-described embodiment, the joint portion 2720 of the coupling member 2700 is electrically connected to the substrate layer 101 of the third connection circuit portion 150 through the second coupling hole 153 and is then electrically connected to the bus bar 500 through the first coupling hole 521. Thus, the coupling member 2700 can electrically connect the flexible circuit board and the bus bar.

In one embodiment, the coupling member 2700 may be composed of a rivet that provides a permanent binding force between thin members. In the case of using a rivet, it is possible to fundamentally prevent distortion due to a welding process or occurrence of cracks or the like generated at a welding portion, thereby improving the coupling reliability.

Second Embodiment

A battery module 2 according to a second embodiment of the present disclosure is partially identical with the battery module 1 according to the above-described first embodiment. Thus, the duplicate descriptions of the same components will be omitted.

Figure 36:
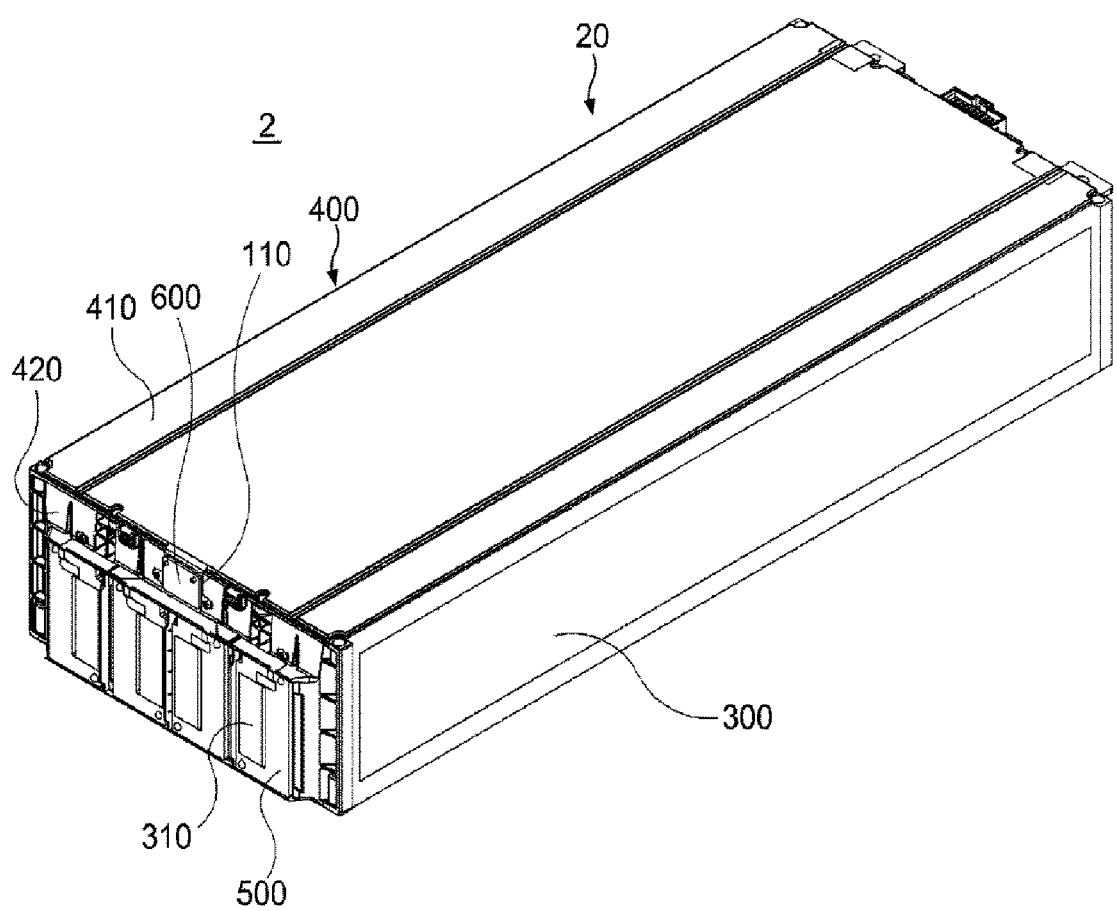
FIG. 36 is a perspective view of a battery module according to a second embodiment of the present disclosure.
Figure 37:
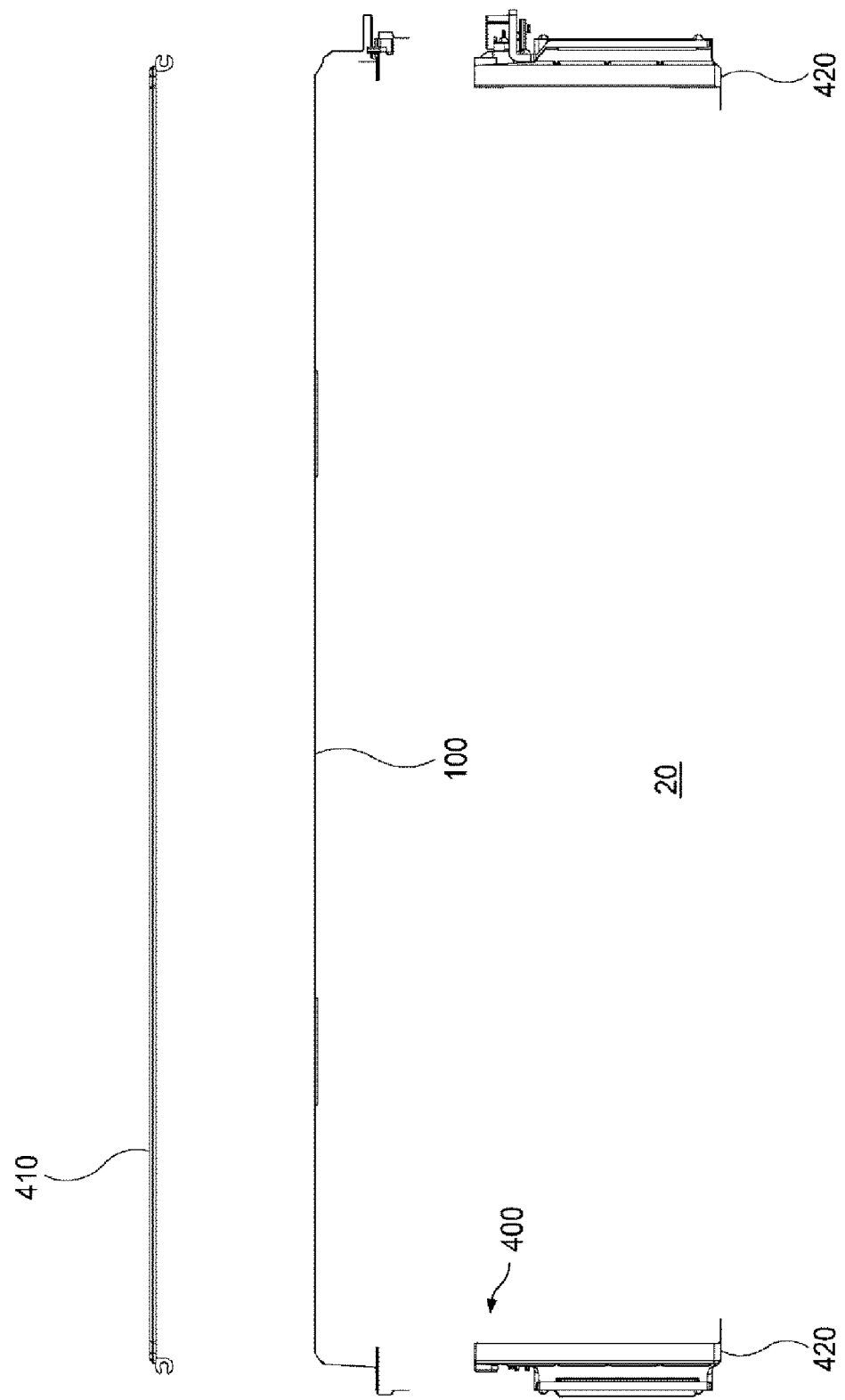
FIG. 37 is a side view showing an exploded configuration of the frame shown in FIG. 36 and the flexible circuit board.
Figure 38:
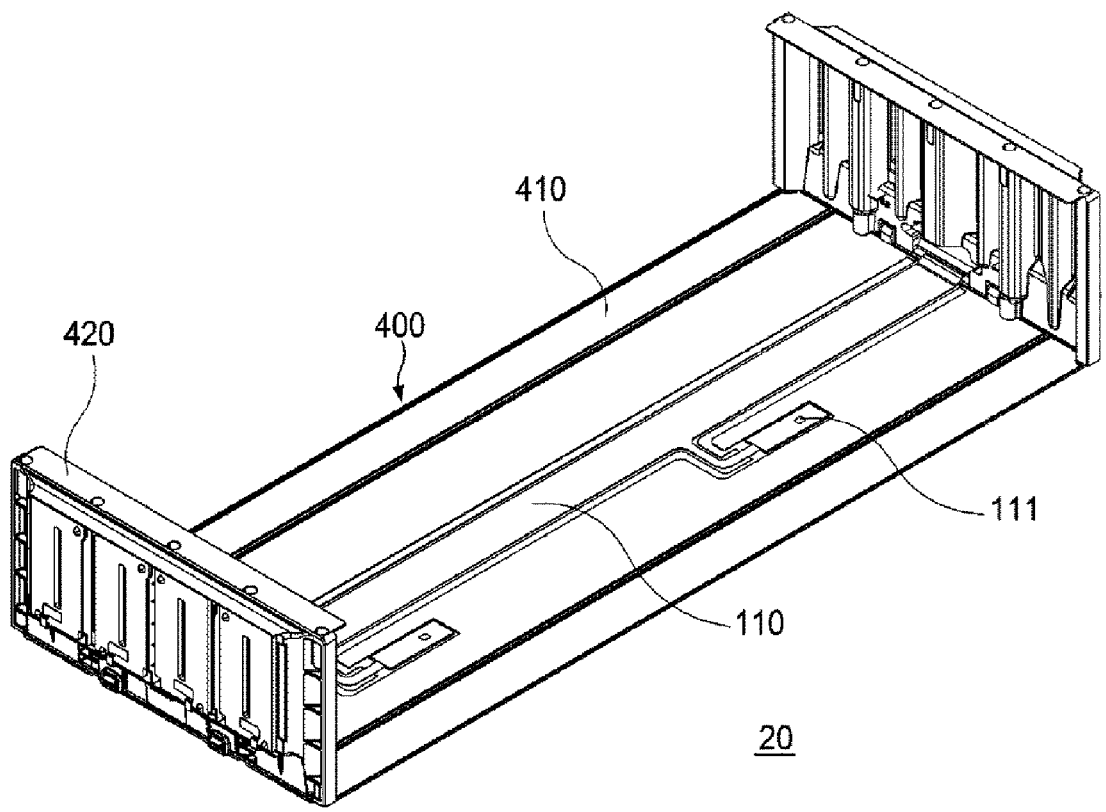
FIG. 38 is a bottom perspective view of the frame shown in FIG. 36.
Figure 39:
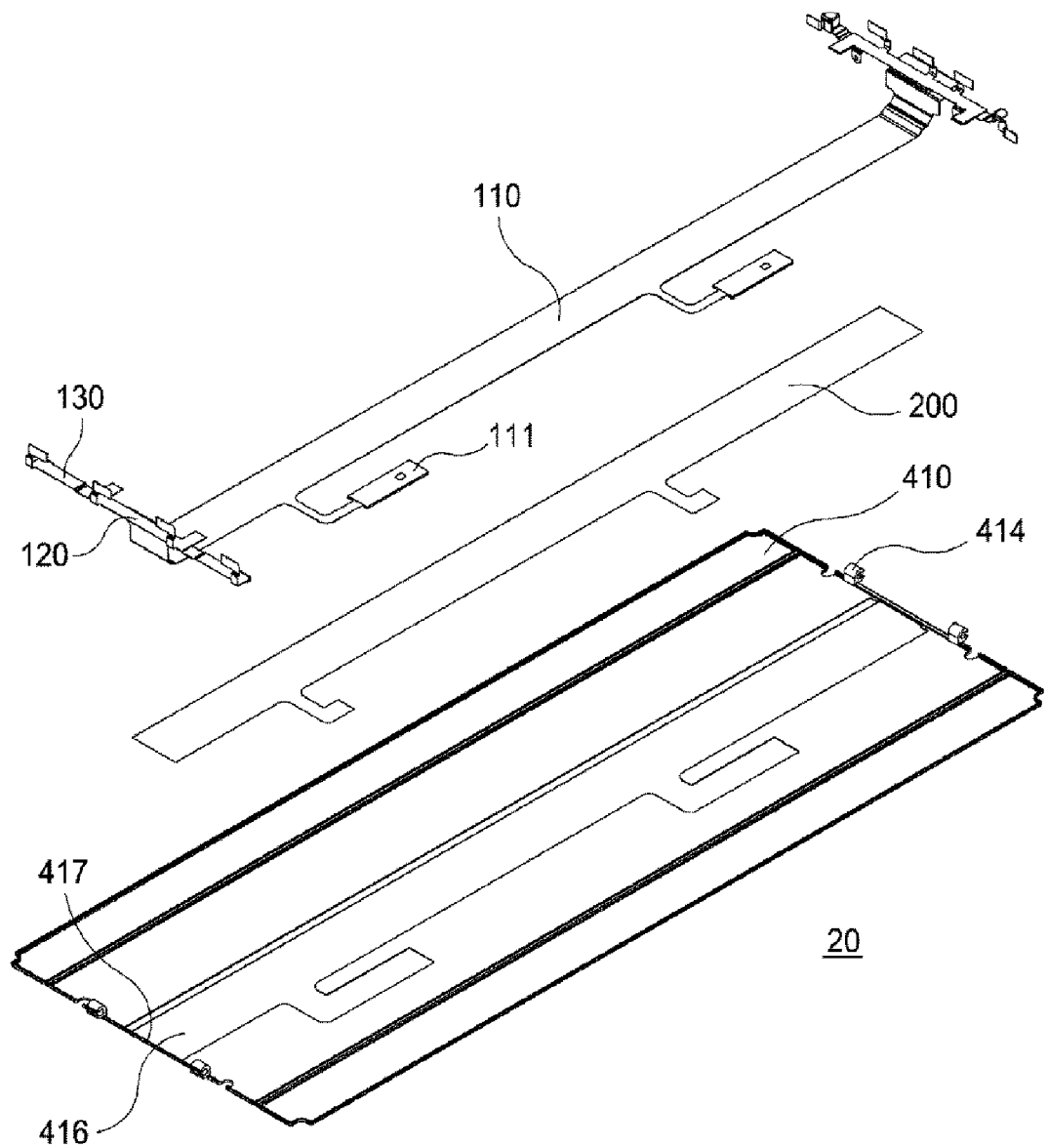
FIG. 39 is an exploded view of the upper plate shown in FIG. 38 and the flexible circuit board.

FIG. 36 is a perspective view of a battery module 2 according to a second embodiment of the present disclosure. FIG. 37 is a side view showing an exploded configuration of the frame 400 shown in FIG. 36 and the flexible circuit board 100. FIG. 38 is a bottom perspective view of the frame 400 shown in FIG. 36. FIG. 39 is an exploded view of the upper plate 410 shown in FIG. 38 and the flexible circuit board 100.

Referring to FIGS. 36 to 39, the battery module 2 according to the second embodiment of the present disclosure may include a cell assembly 300 formed by stacking one or more battery cells and a frame assembly 20 for fixing the cell assembly 300.

The frame assembly 20 may include a frame 400 disposed to surround the cell assembly 300 and provided with an upper plate 410 and side plates 420 connected to both ends of the upper plate 410, bus bars 500 disposed on and fixed to the side plates 420, a flexible circuit board 100 disposed along the upper plate 410 and the side plates 420 to sense a voltage of the battery cells, and reinforcing plates 600 closely fixed to one sides of the side plates 420 to cover the ends of the flexible circuit board 100. The upper plate 410 may have a protection groove 416 formed at a predetermined depth on the bottom surface of the upper plate 410.

In the battery module 2 according to the second embodiment of the present disclosure, as shown in FIG. 37, the central portion 110 of the flexible circuit board 100 may be disposed on the bottom surface of the upper plate 410, and first connection circuit portion 120 and the second connection circuit portion 130 may be disposed on the outer surface of each of the side plates 420.

The central portion 110 is positioned between the upper plate 410 and the cell assembly 300 so that the portion of the flexible circuit board exposed to the outside of the battery module 2 can be minimized. Thus, it is possible to minimize damage to the flexible circuit board 100, such as tearing due to cracks or the like which may occur in an assembly process.

As shown in FIG. 39, a protection groove 416 in which the central portion 110 is received may be formed in the upper plate 410 of the frame 400. The protection groove 416 may be formed in the same shape as the central portion 110.

The central portion 110 may be closely fixed to the protection groove 416 by an adhesive 200. The adhesive 200 may be a double-sided tape 200 having a shape corresponding to the shape of the central portion 110 and the protection groove 416. In the case where the central portion 110 is fixed by the double-sided tape 200, the thermal fusion process can be minimized during the assembly process of the battery module 2. This makes it possible to shorten the production time and to prevent the breakage of the flexible circuit board 100 which may be generated by a pressing operation in a fusion process.

In one embodiment, a protection hole 417 may be formed in at least one of the upper plate 410 and the side plates 420 in a corresponding relationship with the position where the protection groove 416 is formed. The end of the central portion 110 passes through the protection hole 417 so that the first connection circuit portion 120 and the second connection circuit portion 130 can be disposed on the outer surface of each of the side plates 420.

Referring to FIG. 39, the central portion 110 may be bent through the protection hole 417 and may be partially separated. The protection hole 417 may be formed in the upper plate 410 in order to minimize such a problem.

Furthermore, the first connection circuit portion 120 and the second connection circuit portion 130 are formed to become wider than the central portion 110. Therefore, if the central portion 110 is accommodated in and fixed to the protection groove 416 before the upper plate 410 and the side plates 420 are hingedly coupled to each other, it is possible to facilitate the assembly of the frame assembly 20.

Hereinafter, the order of assembling the cell assembly 300 and the frame assembly 20 of the battery module 2 according to the second embodiment of the present disclosure will be described.

Figure 40:
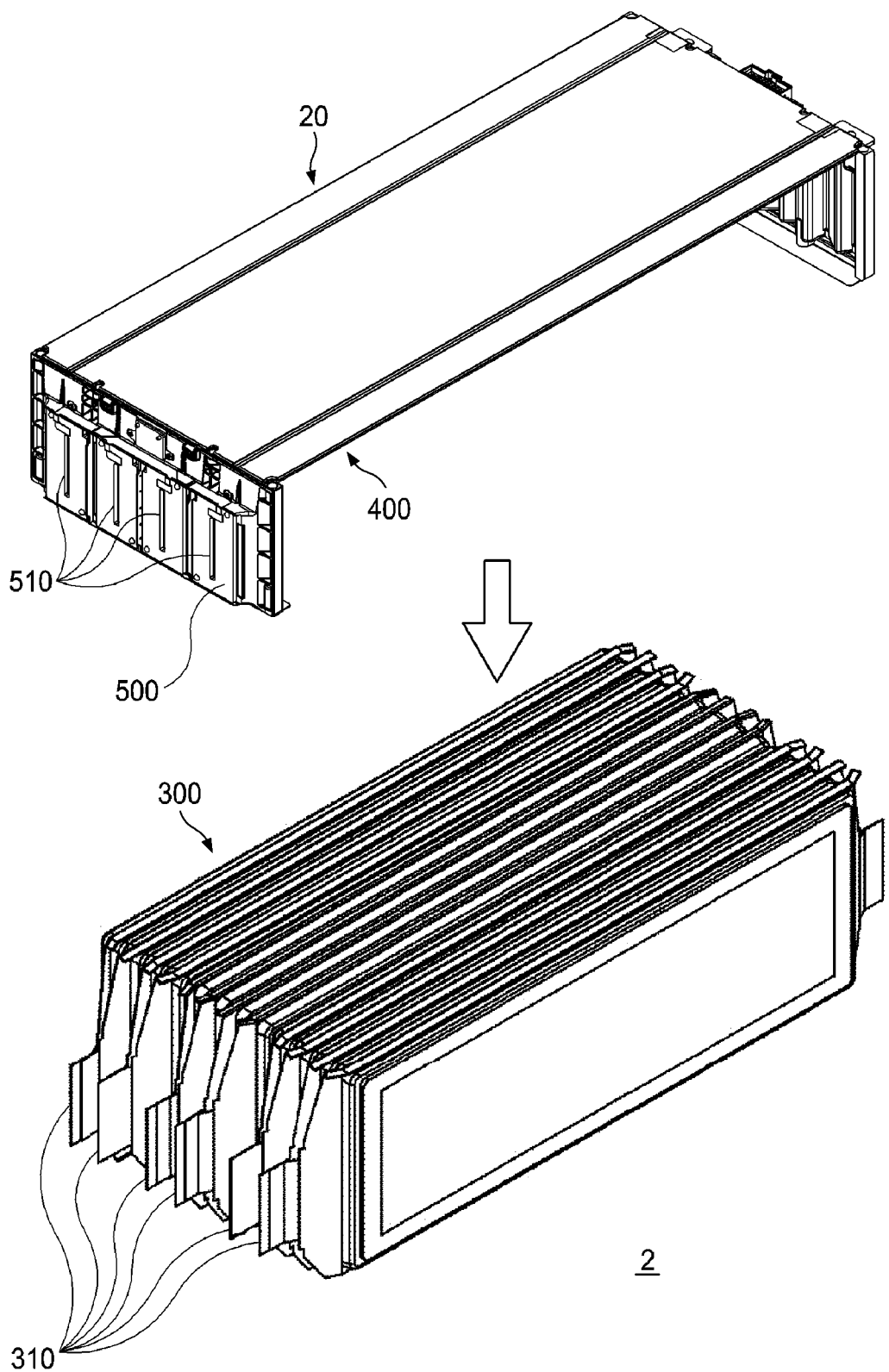
FIG. 40 is a perspective view showing a direction in which the frame assembly is assembled to the cell assembly.
Figure 41:
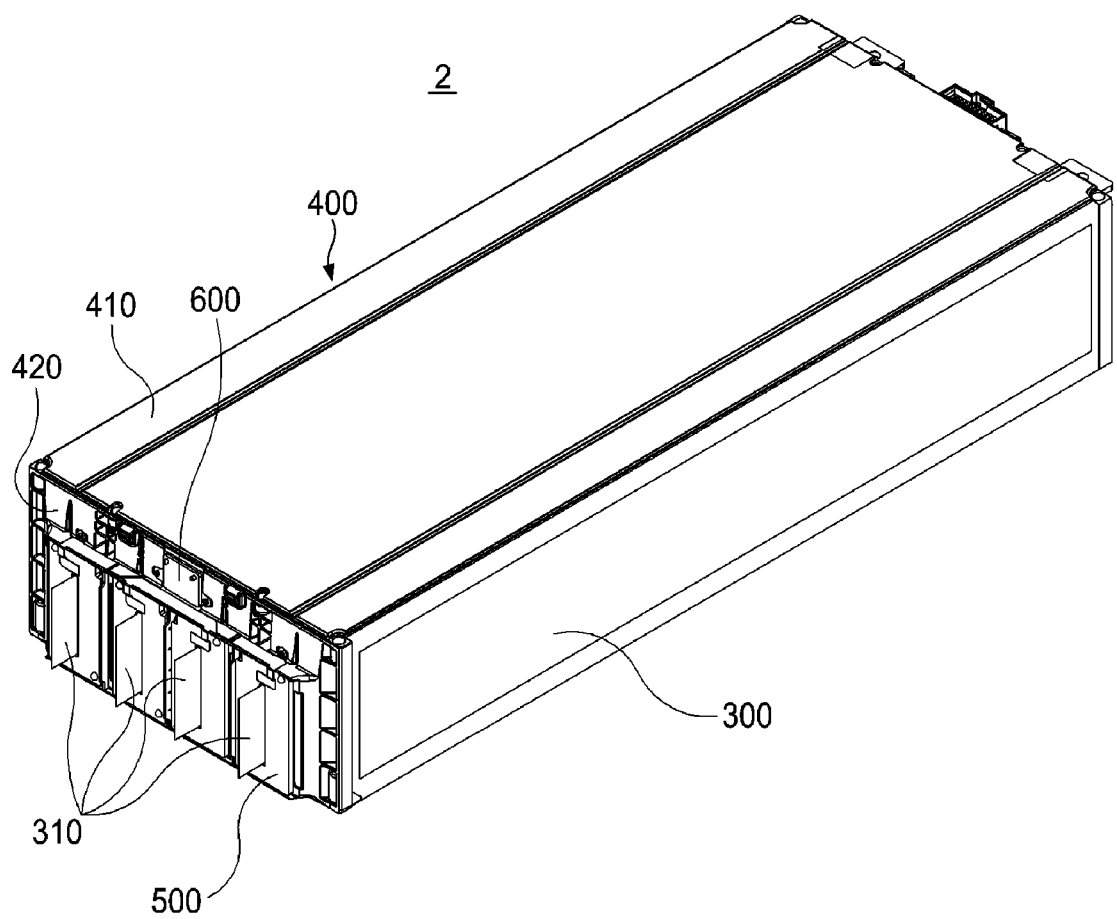
FIG. 41 is a perspective view showing a state in which the terminal portion is inserted into the insertion hole after the cell assembly and the frame assembly are assembled.
Figure 42:
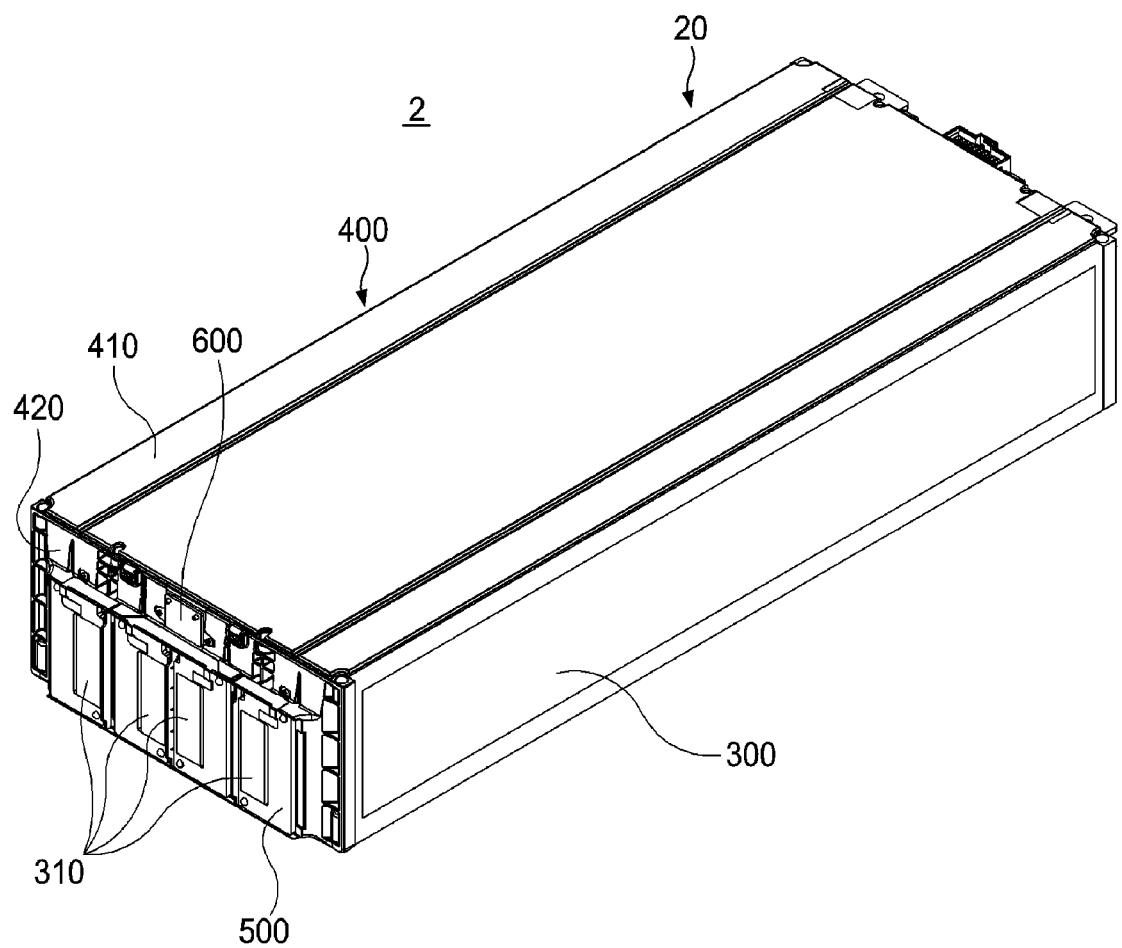
FIG. 42 is a perspective view showing a state in which the terminal portion is inserted into the insertion hole and is then folded and connected to the bus bar.
Figure 43:
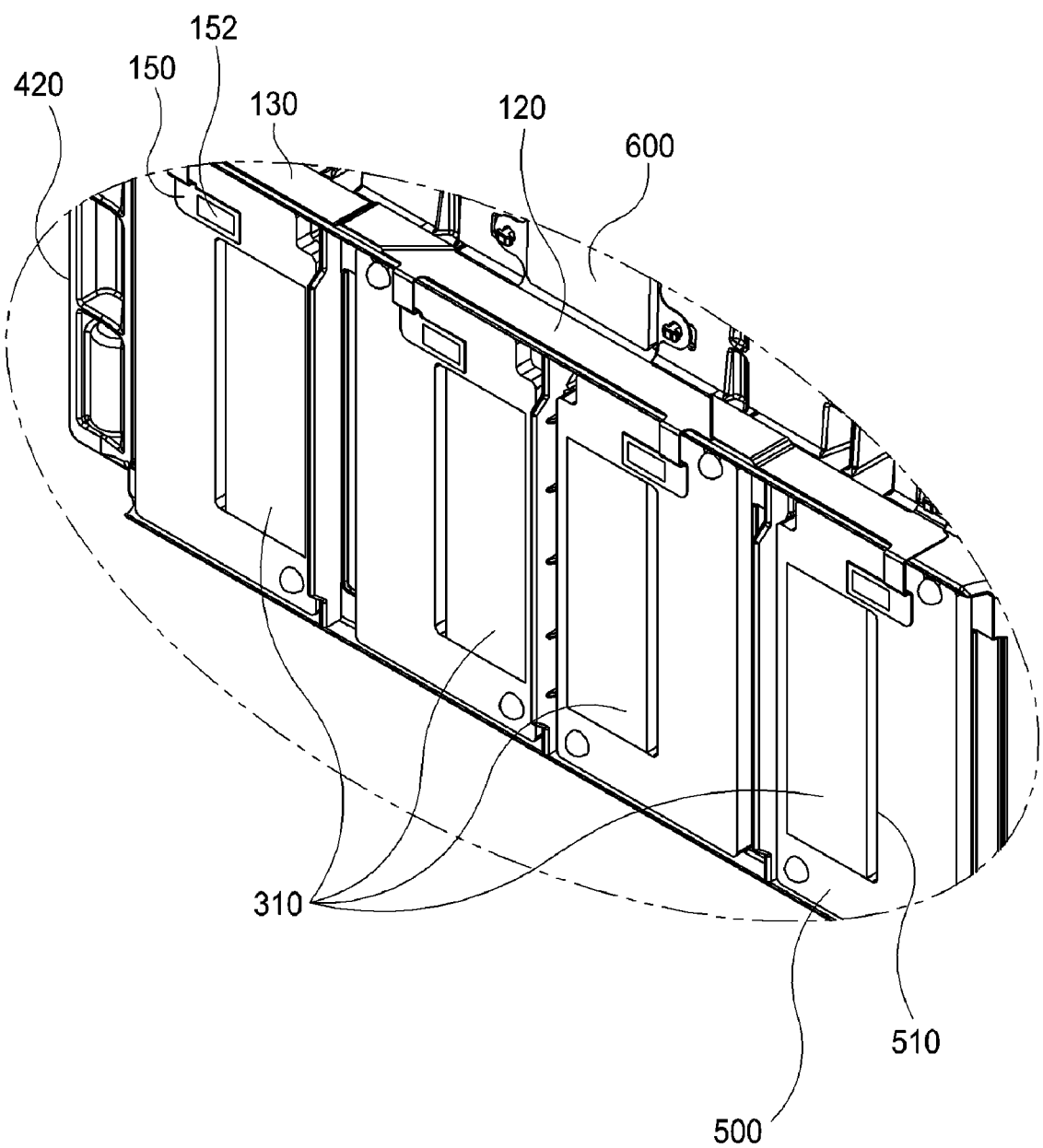
FIG. 43 is an enlarged perspective view of the terminal portion shown in FIG. 42.
Figure 44:
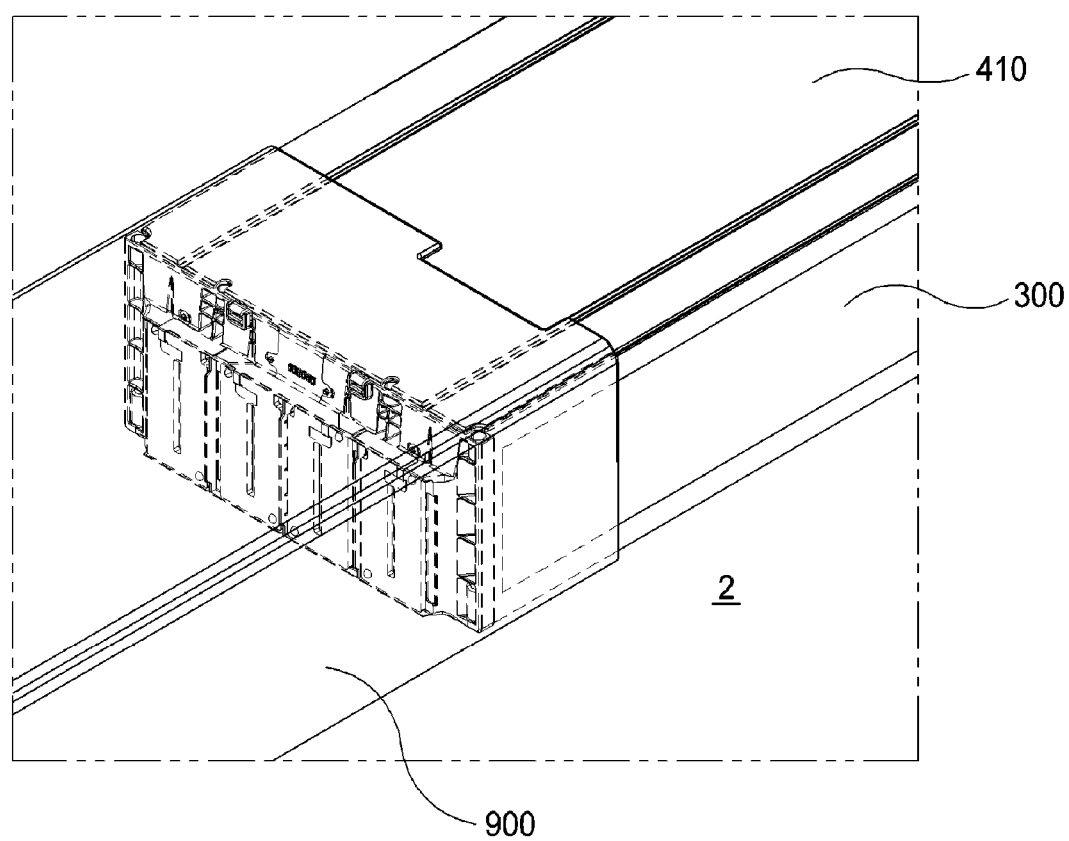
FIG. 44 is a perspective view showing a method of assembling the battery module and the mono frame.

FIG. 40 is a perspective view showing a direction in which the frame assembly 20 is assembled to the cell assembly 300. FIG. 41 is a perspective view showing a state in which the terminal portion 310 is inserted into the insertion hole 510 after the cell assembly 300 and the frame assembly 20 are assembled. FIG. 42 is a perspective view showing a state in which the terminal portion 310 is inserted into the insertion hole 510 and is then folded and connected to the bus bar 500. FIG. 43 is an enlarged perspective view of the terminal portion 310 shown in FIG. 42. FIG. 44 is a perspective view showing a method of assembling the battery module 2 and the mono frame 900.

In one embodiment, the terminal portions 310 of one battery cell may be connected to the terminal portions 310 of the adjacent battery cells to form a stacked cell assembly 300. At this time, the terminal portions 310 may be connected to the adjacent terminal portions 310 while protruding from both sides of the battery cells.

In the frame 400, the upper plate 410 and the side plates 420 may be hingedly coupled to each other. The flexible circuit board 100 may be disposed along the frame 400 and the third connection circuit portion 150 may be disposed while being joined to the bus bar 500.

As shown in FIG. 40, the frame assembly 20 is coupled to the cell assembly 300 from the upper side to the lower side of the cell assembly 300. Since the terminal portions 310 are protruding at this stage, the side plates 420 may be rotated outward about the points of hinge connection with the upper plate 410 so as to spread apart outward with respect to the upper plate 410. Accordingly, the frame assembly 20 may be arranged to surround the outside of the cell assembly 300 without the hindrance of the terminal portions 310.

Next, as shown in FIG. 41, the side plates 420 rotated outward may be rotated inward to be positioned at their original positions. The protruding terminal portions 310 pass through the holes (not shown) formed in the side plates 420 and the insertion holes 510 formed in the bus bar 500 so that the end portions of the terminal portions 310 can protrude outward of the bus bar 500.

The end portions of the terminal portions 310 are formed by joining the terminal portions 310 of the battery cell adjacent to each other and are formed by attaching the terminal portions 310.

Next, as shown in FIG. 42, the end portions of the terminal portions 310 protruding outward are folded to one side and are joined to the outer surface of the bus bar 500. In the joined state, as shown in FIG. 43, the end portions of the terminal portions 310 do not make contact with the end portions of the adjacent other terminal portions 310. Therefore, the battery cells connected to each other by joining one terminal portion 310 with another terminal portion 310 can be electrically connected to other battery cells only by the bus bar 500.

In one embodiment, the terminal portions 310 and the bus bar 500 can be joined by laser welding at the outer side of the end portions of the terminal portions 310 without providing any separate configuration for coupling. This makes it possible to reduce the time and cost required for the production of the battery module.

Referring to FIG. 44, the battery module 2 assembled in the aforementioned manner can be assembled with and fixed to the mono frame 900 once again. The mono frame 900 prevents slipping or breakage of the cell assembly 300 when a vehicle suffers from a traffic accident, thereby preventing a secondary accident such as a fire or the like. Furthermore, the mono frame 900 protects the joint state of the frame 400 and the cell assembly 300 from an external impact. In addition, the mono frame 900 may be made of a metallic material having high strength.

The technical idea of the present disclosure has been described heretofore with reference to some embodiments and examples shown in the accompanying drawings. However, it is to be understood that various substitutions, modifications and alterations may be made without departing from the technical idea and scope of the present disclosure that can be understood by those of ordinary skill in the technical field to which the present disclosure pertains. Further, it is to be understood that such substitutions, modifications and alterations fall within the appended claims.

What is claimed is:

1. A flexible circuit board installed on a frame to which a bus bar is coupled, comprising:
   a central portion having a band shape;
   first connection circuit portions formed at both ends of the central portion and disposed to face each other;

second connection circuit portions extending from the first connection circuit portions in parallel with the central portion; and third connection circuit portions extending from the first connection circuit portions and the second connection circuit portions and connected to the bus bar, wherein the flexible circuit board further includes an overlapped portion including one portion of each of the second connection circuit portions and another portion of each of the second connection circuit portions overlapped with the one portion of each of the second connection circuit portions in a cross-sectional direction being formed when each of the second connection circuit portions is folded toward one side of each of the first connection circuit portions, and each of the second connection circuit portions is disposed on the same line as each of the first connection circuit portions when the overlapped portion is formed.

2. The flexible circuit board of claim 1, wherein the second connection circuit portions are formed at both ends of each of the first connection circuit portions, and the overlapped portion includes;

a first overlapped portion formed by folding each of the second connection circuit portions toward each of the first connection circuit portions along a first bending line; and a second overlapped portion formed by bending and folding each of the second connection circuit portions in a longitudinal direction of each of the first connection circuit portions along a second bending line.

3. The flexible circuit board of claim 2, wherein the first bending line is formed in parallel with each of the first connection circuit portions, and the second bending line is formed to be inclined at a predetermined angle with respect to the first bending line.

4. The flexible circuit board of claim 2, wherein the portions of the second connection circuit portions constituting the first overlapped portion and the second overlapped portion are closely fixed by an adhesive for providing upward and downward fixing forces.

5. The flexible circuit board of claim 1, wherein the third connection circuit portions formed in the first connection circuit portions are spaced apart from each other, and the third connection circuit portions formed in the second connection circuit portions are parallel to the third connection circuit portions formed in the first connection circuit portions when the first connection circuit portions and the second connection circuit portions are positioned in parallel with each other.

6. The flexible circuit board of claim 1, wherein each of the third connection circuit portions includes a substrate layer and insulating layers configured to expose both surfaces of the substrate layer, and the substrate layer includes, a first surface configured to make contact with the bus bar; and a second surface formed on an opposite side of the first surface.

7. The flexible circuit board of claim 6, wherein each of the third connection circuit portions is configured such that the first surface is larger in size than the second surface.

8. A frame assembly for fixing a cell assembly formed by stacking one or more battery cells, comprising:

a frame disposed to surround the cell assembly and provided with an upper plate and side plates connected to both ends of the upper plate;

bus bars disposed on and fixed to the side plates; and a flexible circuit board disposed along the upper plate and the side plates to sense voltages of the battery cells, wherein the upper plate has a path groove recessed at a predetermined depth on an upper surface of the upper plate, the flexible circuit board includes, a band-shaped central portion provided with an outwardly-extending temperature sensing portion and seated in the path groove;

first connection circuit portions formed at both ends of the central portion and disposed to face each other;

second connection circuit portions extending from both ends of each of the first connection circuit portions in parallel with the central portion; and third connection circuit portions extending from the first connection circuit portions and the second connection circuit portions and connected to the bus bars, the flexible circuit board further includes an overlapped portion including a first overlapped portion formed by folding each of the second connection circuit portions toward each of the first connection circuit portions along a first bending line and a second overlapped portion formed by bending and folding each of the second connection circuit portions in a longitudinal direction of each of the first connection circuit portions along a second bending line, when the overlapped portion is formed, each of the second connection circuit portions is disposed on the same line as each of the first connection circuit portions, and the third connection circuit portions formed in the second connection circuit portions are disposed in series with the third connection circuit portions formed in the first connection circuit portions.

9. The frame assembly of claim 8, wherein the cell assembly is formed by stacking, in series or in parallel, terminal portions formed at both ends of each of the battery cells, and the terminal portions are directly joined to and electrically connected to the bus bars.

10. The frame assembly of claim 8, wherein the first bending line is formed in parallel with each of the first connection circuit portions, the second bending line is formed to be inclined at a predetermined angle with respect to the first bending line, and each of the second connection circuit portions is sequentially folded along the first bending line and the second bending line so as to be disposed on the same line as each of the first connection circuit portions.

11. The frame assembly of claim 8, further comprising:

a reinforcing plate closely fixed to one side of each of the side plates and configured to cover ends of the central portion, wherein the upper plate further has ribs formed along the path groove to prevent the central portion from being separated from the path groove.

12. The frame assembly of claim 11, wherein the side plates have fusion protrusions protruding the end of the central portion, and each of the central portion and the reinforcing plate have fixing holes protruded by the fusion protrusions.

13. The frame assembly of claim 8, wherein each of the bus bars has a seat portion recessed at a predetermined depth, and the frame assembly further comprises:
a connection terminal fixedly coupled to the flexible circuit board on one side and joined to each of the bus bars on the other side,
wherein the connection terminal includes a fixing portion provided with fixing protrusions and fixed to each of the third connection circuit portions, and a connecting portion formed to extend from the fixing portion and disposed in the seat portion.

14. The frame assembly of claim 13, wherein the fixing protrusions are formed on both sides of the fixing portion in a spaced-apart relationship with each other,
the fixing protrusions are electrically connected to the flexible circuit board through the third connection circuit portions at predetermined positions,
the fixing protrusions have protrusion portions fixed by compression and deformation, and
the connecting portion is weld to the seat portion by laser welding.

15. The frame assembly of claim 13, wherein the connecting portion is formed in a ring shape so as to have a fastening hole, and the frame assembly further comprises:
a fastening member inserted into the seat portion through the fastening hole to fix the connection terminal.

16. The frame assembly of claim 8, further comprising:
a coating portion configured to cover the third connection circuit portions and a portion of the bus bars around the third connection circuit portions in a state in which the third connection circuit portions are connected to the bus bars.

17. A frame assembly for fixing a cell assembly formed by stacking one or more battery cells, comprising:
a frame disposed to surround the cell assembly and provided with an upper plate and side plates connected to both ends of the upper plate;
bus bars disposed on and fixed to the side plates;
a flexible circuit board disposed along the upper plate and the side plates to sense voltages of the battery cells; and
a reinforcing plate closely fixed to one side of each of the side plates and configured to cover end portions of the flexible circuit board,
wherein the upper plate has a protection groove recessed at a predetermined depth on a bottom surface of the upper plate,
the flexible circuit board includes,
a band-shaped central portion provided with an outwardly-extending temperature sensing portion and accommodated in the protection groove;
first connection circuit portions formed at both ends of the central portion and disposed to face each other;
second connection circuit portions extending from both ends of each of the first connection circuit portions in parallel with the central portion; and
third connection circuit portions extending from the first connection circuit portions and the second connection circuit portions and connected to the bus bars,
the flexible circuit board further includes an overlapped portion including a first overlapped portion formed by folding each of the second connection circuit portions toward each of the first connection circuit portions along a first bending line and a second overlapped portion formed by bending and folding each of the second connection circuit portions in a longitudinal direction of each of the first connection circuit portions along a second bending line,
when the overlapped portion is formed, each of the second connection circuit portions is disposed in parallel with each of the first connection circuit portions, and the third connection circuit portions formed in the second connection circuit portions are disposed in parallel with the third connection circuit portions formed in the first connection circuit portions.

18. The frame assembly of claim 17, wherein a protection hole is formed in at least one of the upper plate and the side plates in a corresponding relationship with a position of the protection groove, and
the central portion has an end portion formed to pass through the protection hole and bent so that each of the third connection circuit portions is joined to an outer surface of each of the bus bars.

19. The frame assembly of claim 17, wherein a first coupling hole is formed in each of the bus bars,
a second coupling hole is formed in each of the third connection circuit portions in a corresponding relationship with a position of the first coupling hole, and
the frame assembly further includes a coupling member configured to pass through the first coupling hole and the second coupling hole.

20. The frame assembly of claim 19, wherein the coupling member is a rivet.

* * * * *